(12) United States Patent
Son et al.

(10) Patent No.: US 12,439,600 B2
(45) Date of Patent: Oct. 7, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Yoonhwan Son, Seoul (KR); Miso Kim, Suwon-si (KR); Joongshik Shin, Yongin-si (KR); Minjae Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 381 days.

(21) Appl. No.: 18/063,878

(22) Filed: Dec. 9, 2022

(65) Prior Publication Data

US 2023/0240073 A1 Jul. 27, 2023

(30) Foreign Application Priority Data

Jan. 27, 2022 (KR) ........................ 10-2022-0012662

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 41/40* (2023.02); *H10B 41/50* (2023.02);
(Continued)

(58) Field of Classification Search
CPC ........ H01L 23/544; H01L 2223/54426; H10B 20/40; H10B 53/20; H10B 43/20–27;
(Continued)

(56) References Cited

U.S. PATENT DOCUMENTS 9,911,751 B2 3/2018 Kwon et al.
9,985,046 B2 5/2018 Lu et al.
(Continued)

FOREIGN PATENT DOCUMENTS

CN 111326526 A 6/2020
CN 112310095 A 2/2021
(Continued)

*Primary Examiner* — Amar Movva
(74) *Attorney, Agent, or Firm* — Fish & Richardson P.C.

(57) ABSTRACT

A semiconductor device includes a substrate having a first region and a second region, a first stack structure in the first region, a first channel structure penetrating through the first stack structure and in contact with the substrate, and a second stack structure on the first stack structure and the first channel structure. The device includes a second channel structure penetrating through the second stack structure and connected to the first channel structure, a first molding structure in the second region, a first alignment structure penetrating through the first molding structure and in contact with the substrate, and a second molding structure on the first molding structure and the first alignment structure. The device includes a second alignment structure penetrating through the second molding structure and connected to the first alignment structure, and a protective layer between the first molding structure and the second molding structure.

20 Claims, 22 Drawing Sheets

(51) Int. Cl.
  *H10B 41/40*    (2023.01)
  *H10B 41/50*    (2023.01)
  *H10B 43/40*    (2023.01)
  *H10B 43/50*    (2023.01)
  *H10D 64/01*    (2025.01)

(52) U.S. Cl.
  CPC .............. *H10B 43/40* (2023.02); *H10B 43/50* (2023.02); *H10D 64/037* (2025.01); *H01L 2223/54426* (2013.01)

(58) Field of Classification Search
  CPC .............. H10B 41/20–27; H10B 51/20; H10B 63/84–845
  See application file for complete search history.

(56) References Cited

U.S. PATENT DOCUMENTS

| | | |
|---|---|---|
| 10,403,766 B2 | 9/2019 | Rhie |
| 10,418,374 B2 | 9/2019 | Lee et al. |
| 10,607,843 B2 | 3/2020 | Watanabe et al. |
| 10,861,877 B2 | 12/2020 | Kim |
| 10,910,390 B2 | 2/2021 | Pu et al. |
| 11,075,111 B2 | 7/2021 | Kim |
| 11,121,092 B2 | 9/2021 | Chen et al. |
| 2021/0028186 A1 | 1/2021 | Lim et al. |

FOREIGN PATENT DOCUMENTS

| | | |
|---|---|---|
| KR | 2007/0096605 A | 10/2007 |
| KR | 2014/0063145 A | 5/2014 |

SEMICONDUCTOR DEVICES AND DATA STORAGE SYSTEMS INCLUDING THE SAME

CROSS-REFERENCE TO RELATED APPLICATION

This application claims the benefit of priority to Korean Patent Application No. 10-2022-0012662 filed on Jan. 27, 2022 in the Korean Intellectual Property Office, the disclosure of which is incorporated herein by reference in its entirety.

BACKGROUND

The present inventive concepts relate to semiconductor devices and/or data storage systems including the same.

In a data storage system desiring or requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Some example embodiments provide a semiconductor device having improved reliability.

Some example embodiments provide a data storage system including a semiconductor device having improved reliability.

According to an example embodiment, a semiconductor device includes a substrate having a first region and a second region, a first stack structure in the first region, the first stack structure including lower gate electrodes spaced apart from each other and stacked in a first direction, the first direction perpendicular to an upper surface of the substrate, a first channel structure penetrating through the first stack structure and in contact with the substrate, and a second stack structure on the first stack structure and the first channel structure, the second stack structure including upper gate electrodes spaced apart from each other and stacked in the first direction. The device includes a second channel structure penetrating through the second stack structure and connected to the first channel structure, a first molding structure in the second region, the first molding structure including lower horizontal sacrificial layers spaced apart from each other and stacked in the first direction, a first alignment structure penetrating through the first molding structure and in contact with the substrate, and a second molding structure on the first molding structure and the first alignment structure, the second molding structure including upper horizontal sacrificial layers spaced apart from each other and stacked in the first direction. The device includes a second alignment structure penetrating through the second molding structure and connected to the first alignment structure, and a protective layer between the first molding structure and the second molding structure. Among the upper horizontal sacrificial layers, a lowermost first horizontal sacrificial layer has an upper surface on a first level on the first alignment structure, a second level on the first molding structure of a periphery of the first alignment structure, and a third level on the protective layer, the second level is lower than the first level, and the third level is higher than the first level.

According to an example embodiment, a semiconductor device includes a substrate having a first region and a second region, a first stack structure in the first region, the first stack structure including lower gate electrodes spaced apart from each other and stacked in a first direction, the first direction perpendicular to an upper surface of the substrate, a first channel structure penetrating through the first stack structure and in contact with the substrate, a second stack structure on the first stack structure and the first channel structure, the second stack structure including upper gate electrodes spaced apart from each other and stacked in the first direction, and a second channel structure penetrating through the second stack structure and connected to the first channel structure. The device includes a first molding structure in the second region, the first molding structure including lower horizontal sacrificial layers spaced apart from each other and stacked in the first direction, a first alignment structure penetrating through the first molding structure and in contact with the substrate, a second molding structure on the first molding structure and the first alignment structure, the second molding structure including upper horizontal sacrificial layers spaced apart from each other and stacked in the first direction, and the second molding structure having a key pattern portion recessed downwardly on the first alignment structure, and a protective layer between the first molding structure and the second molding structure.

According to an example embodiment, a data storage system including a semiconductor storage device including a substrate having a first region and a second region, circuit devices on one side of the substrate, and an input/output pad electrically connected to the circuit devices, and a controller electrically connected to the semiconductor storage device through the input/output pad and configured to control the semiconductor storage device. The semiconductor storage device further includes a substrate having a first region and a second region, a first stack structure in the first region, the first stack structure including lower gate electrodes spaced apart from each other and stacked in a first direction, the first direction perpendicular to an upper surface of the substrate, a first channel structure penetrating through the first stack structure and in contact with the substrate, a second stack structure on the first stack structure and the first channel structure, the second stack structure including upper gate electrodes spaced apart from each other and stacked in the first direction, and a second channel structure penetrating through the second stack structure and connected to the first channel structure. The device includes a first molding structure in the second region, the first molding structure including lower horizontal sacrificial layers spaced apart from each other and stacked in the first direction, a first alignment structure penetrating through the first molding structure and in contact with the substrate, a second molding structure on the first molding structure and the first alignment structure, the second molding structure including upper horizontal sacrificial layers spaced apart from each other and stacked in the first direction, and the second molding structure having a key pattern portion recessed downwardly on the first alignment structure, and a protective layer between the first molding structure and the second molding structure.

BRIEF DESCRIPTION OF DRAWINGS

The above and other example embodiments of the present inventive concepts will be more clearly understood from the following detailed description, taken in conjunction with the accompanying drawings.

DETAILED DESCRIPTION

Hereinafter, some example embodiments will be described with reference to the accompanying drawings.

Figure 1:
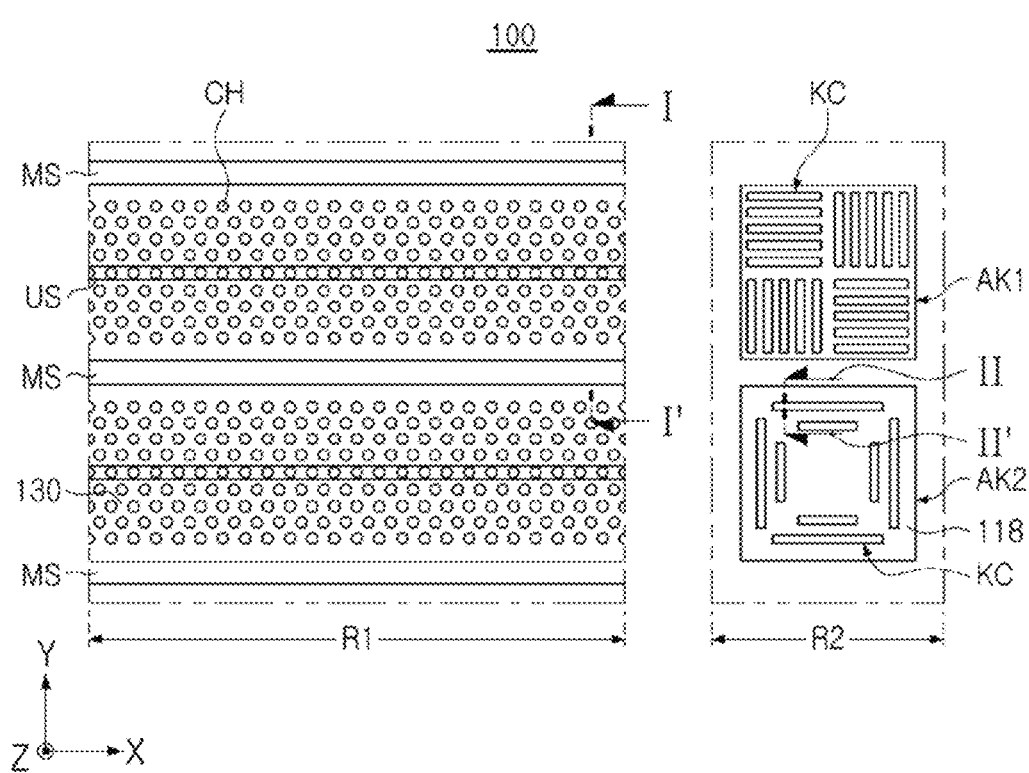
FIG. 1 is a schematic plan view of a semiconductor device according to some example embodiments.

FIG. 1 is a schematic plan view of a semiconductor device according to some example embodiments.

Figure 2:
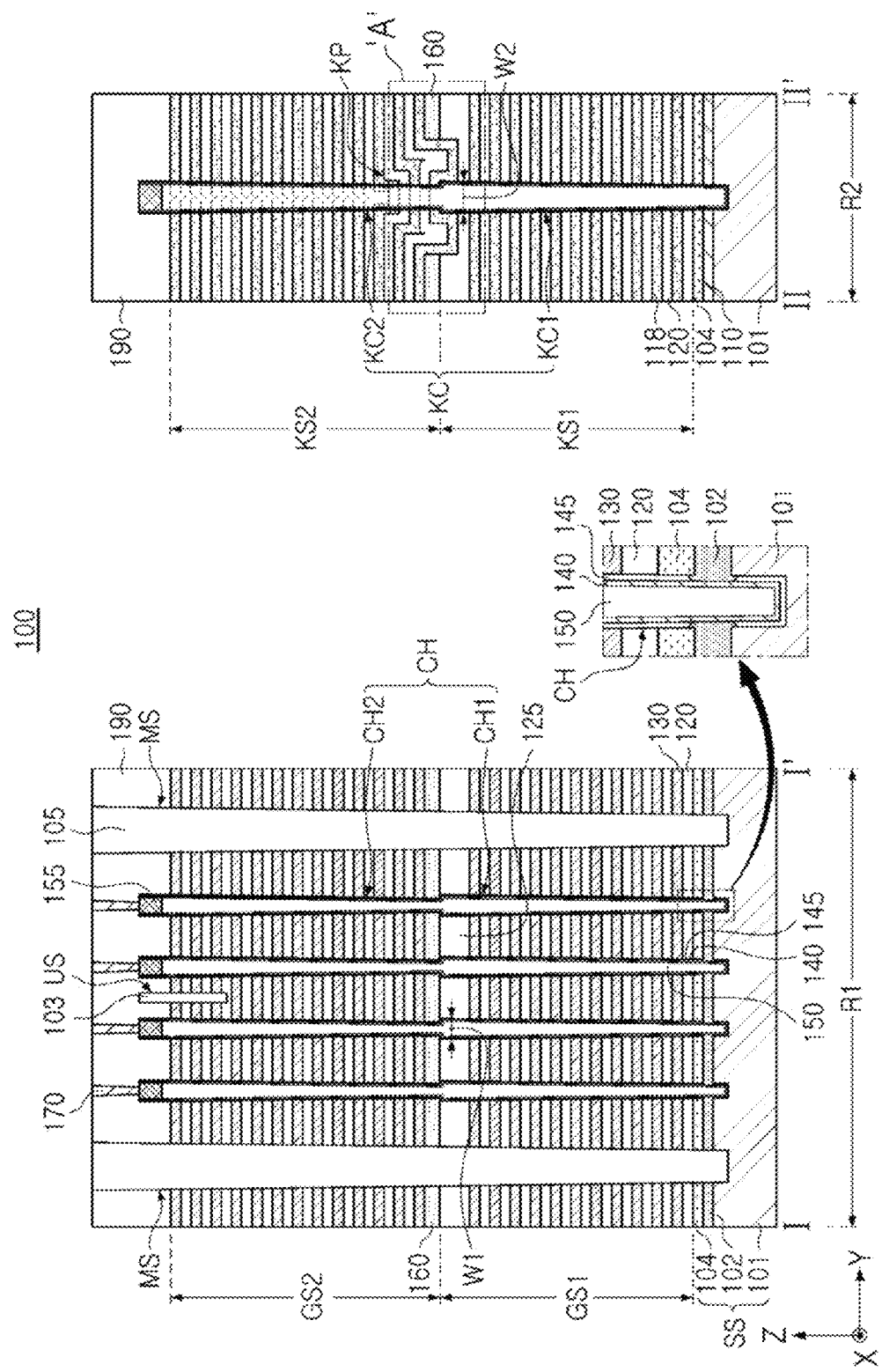
FIG. 2 is a schematic cross-sectional view of a semiconductor device according to some example embodiments.

FIG. 2 is a schematic cross-sectional view of a semiconductor device according to some example embodiments. FIG. 2 illustrates cross-sections, respectively taken along lines I-II' and II-II' of FIG. 1

Figure 3:
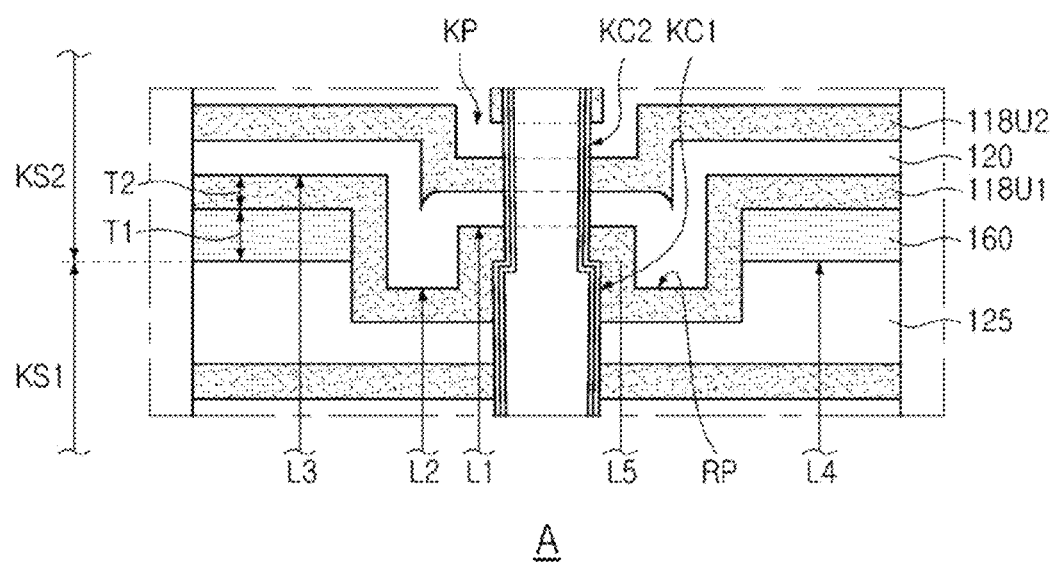
FIG. 3 is a partially enlarged view of regions of a semiconductor device according to some example embodiments.

FIG. 3 is a partially enlarged view of regions of a semiconductor device according to some example embodiments. FIG. 3 illustrates an enlarged view of region "A" of FIG. 2.

Referring to FIGS. 1 to 3, a semiconductor device 100 may include a substrate 101 having first and second regions R1 and R2.

In the first region R1, the semiconductor device 100 may include first and second horizontal conductive layers 102 and 104 on a substrate 101, first and second stack structures GS1 and GS2 including gate electrodes 130 and interlayer insulating layers 120, channel structures CH disposed to penetrate through the first and second stack structures GS1 and GS2 and each including a channel layer 140, upper separation regions US penetrating through a portion of the second stack structure GS2, separation regions MS extending while penetrating through the first and second stack structures GS1 and GS2, contact plugs 170 on the channel structures CH, a protective layer 160 between the first stack structure GS1 and the second stack structure GS2, and a cell region insulating layer 190 covering the first and second stack structures GS1 and GS2 and the channel structures CH.

In the second region R2, the semiconductor device 100 may include one or more alignment key regions AK1 and AK2. In the second region R2, the semiconductor device 100 may include a horizontal insulating layer 110 and a second horizontal conductive layer 104 on the substrate 101, first and second molding structures KS1 and KS2 including horizontal sacrificial layers 118 and interlayer insulating layers 120, an alignment structure KC disposed to penetrate through the first and second molding structures KS1 and KS2 and including a channel layer 140, a protective layer 160 between the first molding structure KS1 and the second molding structure KS2, and a cell region insulating layer 190 covering the first and second molding structures KS1 and KS2 and the alignment structure KC.

In the semiconductor device 100, the first region R1 may be a region in which memory cell strings including memory cells are disposed with respect to the channel structures CH, and the second region R2 may be a region, disposed outside the first region R1, in which memory cells are not disposed. For example, the semiconductor device 100 may further include a peripheral circuit region including circuit devices applying electrical signals to the memory cells of the first region R1, and the second region R2 may be a region disposed on one side of the peripheral circuit region or a dummy region disposed outside the peripheral circuit region. In some example embodiments, the second region R2 may be disposed in a scribe lane between memory chip regions. In this case, the semiconductor device 100 may be a semiconductor structure before being diced.

The substrate 101 may have an upper surface extending in an X-direction and a Y-direction. The substrate 101 may include a semiconductor material, for example, a group IV semiconductor, a group III-V compound semiconductor, or a group II-VI compound semiconductor, but example embodiments are not limited thereto. For example, the group IV semiconductor may include silicon, germanium, or silicon-germanium, but example embodiments are not limited thereto. The substrate 101 may be provided as a bulk wafer, an epitaxial layer, an epitaxial layer, a silicon-on-insulator (SOI) layer, a semiconductor-on-insulator (SeOI) layer, or the like.

The first and second regions R1 and R2 of the substrate 101 may be spaced apart from each other. For ease of description, the first and second regions R1 and R2 are referred to as regions of the substrate 101, but may be referred to as regions of the semiconductor device 100 according to a manner of description.

The first and second horizontal conductive layers 102 and 104 may be sequentially stacked and disposed on an upper of the first region R1 of the substrate 101. The first and second horizontal conductive layers 102 and 104 may constitute a source structure SS together with the substrate 101. The source structure SS may function as a common source line of the semiconductor device 100. As illustrated in the enlarged view of FIG. 2, the first horizontal conductive layer 102 may be directly connected to the channel layer 140 on a periphery of the channel layer 140.

The first and second horizontal conductive layers 102 and 104 may include a semiconductor material, for example, polycrystalline silicon. In this case, at least the first horizontal conductive layer 102 may be doped with impurities having the same or substantially the same conductivity type as the substrate 101. The second horizontal conductive layer 104 may be a doped layer, or an intrinsic semiconductor layer including impurities diffused from the first horizontal conductive layer 102. However, the material of the second horizontal conductive layer 104 is not limited to a semiconductor material and, in some example embodiments, the second horizontal conductive layer 104 may be replaced with an insulating layer. In some example embodiments, a relatively thin insulating layer may be interposed between the first horizontal conductive layer 102 and the second horizontal conductive layer 104.

The horizontal insulating layer 110 may be disposed on the substrate 101 on the same or substantially the same level as the first horizontal conductive layer 102 in the second region R2. The horizontal insulating layer 110 may include a plurality of insulating layers, alternately stacked on the substrate 101. The horizontal insulating layer 110 may remain after a portion of the first horizontal conductive layer 102 is replaced with the first horizontal conductive layer 102 in the process of fabricating the semiconductor device 100. The horizontal insulating layer 110 may include at least one of a silicon oxide, a silicon nitride, a silicon carbide, and a silicon oxynitride, but example embodiments are not limited thereto.

The first and second stack structures GS1 and GS2 may be sequentially stacked from the substrate 101 in a Z-direction. Each of the first and second stack structures GS1 and GS2 may include gate electrodes 130 and interlayer insulating layers 120, disposed alternately with the gate electrodes 130. The first stack structure GS1 may further include an upper interlayer insulating layer 125 disposed on an uppermost portion thereof and having a relatively large thickness.

The gate electrodes 130 may be vertically spaced apart from each other and stacked on the substrate 101 in the first region R1 to constitute the first and second stack structures GS1 and GS2. The gate electrodes 130 of the first stack structure GS1 may be referred to as lower gate electrodes, and the gate electrodes 130 of the second stack structure GS2 may be referred to as upper gate electrodes.

At least one gate electrode 130, including the lowermost gate electrode 130, among the gate electrodes 130, may constitute a ground select transistor, and at least one gate electrode 130 including the uppermost gate electrode 130, among the gate electrodes 130, may constitute a string select transistor. The other gate electrodes 130 may constitute a plurality of memory cells, and the number of gate electrodes 130 constituting the memory cells may be determined depending on the capacity of the semiconductor device 100. In some example embodiments, the gate electrode 130 disposed above the string select transistor and/or below the ground select transistor may constitute an erase transistor used in an erase operation using a gate induced drain leakage (GIDL) phenomenon. Some of the gate electrodes 130, for example, the gate electrodes 130 above and/or below the gate electrodes 130 constituting the memory cells may be dummy gate electrodes.

The gate electrodes 130 may be disposed to be separated in desired (or, alternatively predetermined) units by separation regions in the Y-direction. The gate electrodes 130 may constitute a single memory block between a pair of separation regions MS, but example embodiments are not limited thereto.

The gate electrodes 130 may include a metal material, for example, tungsten (W). In some example embodiments, the gate electrodes 130 may include polycrystalline silicon, a metal silicide material, etc. According to some example embodiments, the gate electrodes 130 may further include a diffusion barrier. For example, the diffusion barrier may include tungsten nitride (WN), tantalum nitride (TaN), or titanium nitride (TiN), or combinations thereof, but example embodiments are not limited thereto.

The first and second molding structures KS1 and KS2 may be sequentially stacked from the substrate 101 in the Z-direction. Each of the first and second molding structures KS1 and KS2 may include horizontal sacrificial layers 118 and interlayer insulating layers 120, disposed alternately with the horizontal sacrificial layers 118. The first molding structure KS1 may further include an upper interlayer insulating layer 125 disposed on an uppermost portion thereof and having a relatively large thickness.

The second molding structure KS2 may be disposed to have a shape in which the first molding structure KS1, for example, the upper interlayer insulating layer 125 is recessed to a desired (or, alternatively predetermined) thickness on a periphery of the alignment structure KC. Accordingly, at least one of the horizontal sacrificial layers 118 and the interlayer insulating layers 120, constituting the second molding structure KS2, may have a key pattern portion KP, a region recessed or depressed toward the substrate 101. This will be described later in greater detail with reference to FIG. 3.

The horizontal sacrificial layers 118 may be vertically spaced apart from each other and stacked on the substrate 101 in the second region R2 to constitute the first and second molding structures KS1 and KS2. The horizontal sacrificial layers 118 of the first molding structure KS1 may be referred to as a lower horizontal sacrificial layer, and the horizontal sacrificial layers 118 of the second molding structure KS2 will be referred to as an upper horizontal sacrificial layer.

The horizontal sacrificial layers 118 may be disposed to have the same or substantially the same thickness as the gate electrodes 130 and may be disposed on the same or substantially the same level as the gate electrodes 130. The horizontal sacrificial layers 118 may be formed of an insulating material, different from that of the interlayer insulating layers 120. The horizontal sacrificial layers 118 may include, for example, a silicon oxide, a silicon nitride, or a silicon oxynitride, but example embodiments are not limited thereto.

The protective layer 160 may be disposed between the first stack structure GS1 and the second stack structure GS2 in the first region R1, and may be disposed between the first molding structure KS1 and the second molding structure KS2 in the second region R2. According to a manner of the description, the protective layer 160 may be described as being included in the second stack structure GS2 and the second molding structure KS2.

In the first region R1, the passivation layer 160 may horizontally extend on the upper interlayer insulating layer 125. Referring to FIG. 3, in the second region R2, the protective layer 160 may be disposed on a periphery of the recessed portion RP and may not overlap the first alignment structure KC1. The protective layer 160 may be spaced apart from the alignment structure KC in the X-direction and the Y-direction to surround the alignment structure KC. A thickness T1 of the passivation layer 160 may be greater than a thickness T2 of each of the horizontal sacrificial layers 118, but the thicknesses T1 and T2 are not limited thereto and may vary according to example embodiments.

The protective layer 160 may include an insulating material, for example, a silicon oxide, a silicon nitride, or a silicon oxynitride, but example embodiments are not limited thereto. For example, the protective layer 160 may be formed of the same or substantially the same material as the interlayer insulating layers 120 and the upper interlayer insulating layer 125. In this case, a boundary between the protective layer 160 and the upper interlayer insulating layer 125 may not be distinguished.

The interlayer insulating layers 120 may be disposed between the gate electrodes 130 in the first region R1, and may be disposed between the horizontal sacrificial layers 118 in the second region R2. Similarly to the gate electrodes 130 and the horizontal sacrificial layers 118, the interlayer insulating layers 120 may be spaced apart from each other in a direction, perpendicular to the upper surface of the substrate 101, and may be disposed to extend in the X-direction. A relatively thick upper interlayer insulating layer 125 may be disposed between the first and second stack structures GS1 and GS2 and between the first and second molding structures KS1 and KS2. However, the relative thicknesses and disposition locations of the interlayer insulating layers 120 and the upper interlayer insulating layer 125 may vary according to example embodiments. The interlayer insulating layers 120 and the upper interlayer insulating layer 125 may include an insulating material such as a silicon oxide, a silicon nitride, etc.

The channel structures CH may each constitute a single memory cell string, and may be disposed to be spaced apart from each other in rows and columns in the first region R1. The channel structures CH may be disposed to form a grid pattern in an X-Y plane, may be disposed in zigzag form in one direction, etc. The channel structures CH may have a columnar shape, and may have an inclined side surface narrowed in a direction toward the substrate 101 depending on an aspect ratio.

The channel structures CH may include first and second channel structures CH1 and CH2, vertically stacked. The first channel structures CH1 may penetrate through the first stack structure GS1 to be in contact with the substrate 101, and the second channel structures CH2 may penetrate through the second stack structure GS2 to be in contact with the first channel structure CH1. The channel structures CH may have a bent portion formed by a difference in width in a region in which the first channel structures CH1 and the second channel structures CH2 are connected to each other. However, the number of channel structures stacked in the Z-direction may vary according to example embodiments.

Each of the channel structures CH may include a gate dielectric layer 145, a channel layer 140, a channel buried insulating layer 150, sequentially disposed in a channel hole, and a channel pad 155. The channel layer 140, the gate dielectric layer 145, and the channel buried insulating layer 150 may be connected to each other between the first channel structure CH1 and the second channel structure CH2.

As illustrated in the enlarged view of FIG. 2, the channel layer 140 may be formed to have an annular shape surrounding the channel buried insulating layer 150. However, according to some example embodiments, the channel layer 140 may have a columnar shape such as a cylindrical shape or a prismatic shape without the channel buried insulating layer 150. The channel layer 140 may be connected to the first horizontal conductive layer 102 below the channel layer 140. The channel layer 140 may include a semiconductor material such as doped or undoped polycrystalline silicon or single-crystalline silicon, but example embodiments are not limited thereto.

The gate dielectric layer 145 may be disposed between the gate electrodes 130 and the channel layer 140. Although not illustrated in detail, the gate dielectric layer 145 may include a tunneling layer, a charge storage layer, and a blocking layer, sequentially stacked from the channel layer 140. The tunneling layer may tunnel charges to the charge storage layer and may include, for example, silicon oxide ($SiO_2$), silicon nitride ($Si_3N_4$), silicon oxynitride (SiON), or combinations thereof, but example embodiments are not limited thereto. The charge storage layer may be a charge trapping layer and/or a floating gate conductive layer. The blocking layer may include silicon oxide ($SiO_2$), silicon nitride ($Si_3N_4$), silicon oxynitride (SiON), a high-k dielectric material, or combinations thereof, but example embodiments are not limited thereto. In some example embodiments, at least a portion of the gate dielectric layer 145 may extend along the gate electrodes 130 in a horizontal direction.

The channel pad 155 may be disposed on only an upper end of the second channel structure CH2 disposed thereon. The channel pad 155 may include, for example, doped polycrystalline silicon.

The alignment structures KC may be disposed in the second region R2, and may be arranged to have a desired (or, alternatively predetermined) pattern in the alignment key regions AK1 and AK2, as illustrated in FIG. 1. The alignment key regions AK1 and AK2 may be regions in which alignment keys for alignment between upper and lower patterns in a photolithography process, among processes of fabricating the semiconductor device 100 are disposed. However, the number of the alignment key regions AK1 and AK2, a shape and a size of a pattern formed by the alignment structures KC in each of the alignment key regions AK1 and AK2, and the like, may vary according to example embodiments.

The alignment structure KC may include first and second alignment structures KC1 and KC2, vertically stacked. The first alignment structure KC1 may penetrate through the first molding structure KS1 to be in contact with the substrate 101, and the second alignment structure KC2 may penetrate through the second molding structure KS2 to be connected to the first structure KC1. The alignment structure KC may have a bent portion formed by a difference in width in a region in which the first alignment structure KC1 and the second alignment structure KC2 are connected to each other.

The alignment structure KC may have the same internal structure as the channel structure CH. The same internal structure means that the types and stacking order of layers disposed therein are the same or substantially the same. Therefore, the alignment structure KC may include a gate dielectric layer 145, a channel layer 140, a channel buried insulating layer 150, sequentially disposed in the opening, and a channel pad 155. However, unlike the channel structure CH, the alignment structures KC are not applied with an electrical signal by the contact plug 170, or the like, and do not constitute a memory cell string, and thus, may be referred to as a dummy channel structure. A second width W2 of the alignment structure KC in one direction may be greater than or equal to a first width W1 of the channel structure CH.

Referring to FIG. 3, a first horizontal sacrificial layer 118U1 of a lowermost portion of the second molding structure KS2 may cover a portion of an upper surface and an upper portion of a side surface of the first alignment structure KC1 and extend along a region in which the upper interlayer insulating layer 125 of the first molding structure KS1 is recessed, and may then extend along a side surface and an upper surface of the protective layer 160. Accordingly, the first horizontal sacrificial layer 118U1 may be disposed, based on an upper surface thereof, on a first level L1 on the first alignment structure KC1, on a second level L2, lower than the first level L1, on the first molding structure KS1 of a periphery of the first alignment structure KC1, on a third level L3, higher than the first level L1, on the protective layer 160. Thus, the first horizontal sacrificial layer 118U1 may have a key pattern portion KP corresponding to a region, lower than the third level L3, and may have a recessed portion RP recessed toward the substrate 101 on the periphery of the first alignment structure KC1.

An upper surface of the first molding structure KS1 may be disposed on a fourth level L4, lower than the first level L1 and higher than the second level L2. The fourth level L4 may be substantially the same as the fifth level L5 of an upper surface of the first alignment structure KC1. In the first region R1, an upper surface of the lowermost gate electrode 130 of the second stack structure GS2 may be disposed on the third level L3.

The horizontal sacrificial layers 118 and the interlayer insulating layers 120 may be conformally formed on the first horizontal sacrificial layer 118U1 to have a recess-shaped key pattern portion KP corresponding to a center of the first alignment structure KC1. However, the key pattern portion KP may have a gradually smoothed shape in the horizontal sacrificial layers 118 on the first horizontal sacrificial layer 118U1. For example, the second horizontal sacrificial layer 118U2 on the first horizontal sacrificial layer 118U1 may have a recessed portion without having a recessed portion RP. As represented by dashed lines of FIG. 2, key pattern portions KP of the upper layers, among the key pattern portions KP, may be penetrated through by the second alignment structure KC2, and thus, may not remain finally. As described above, the key pattern portions KP may serve as an alignment key for alignment between upper and lower patterns during the process of fabricating the semiconductor device 100.

The separation regions MS may extend in the X-direction through the first and second stack structures GS1 and GS2 and the first and second horizontal conductive layers 102 and 104, and may be connected to the substrate 101 in the first region R1. As illustrated in 1, the separation regions MS may be disposed to be parallel to each other. The separation regions MS may separate the gate electrodes 130 from each other in the Y-direction. The separation regions MS may have a shape having a width decreased in a direction toward the substrate 101 depending on a high aspect ratio. The separation regions MS may include a separation insulating layer 105 disposed in a trench. The separation insulating layer 105 may include an insulating material, for example, a silicon oxide, a silicon nitride, or a silicon oxynitride, but example embodiments are not limited thereto.

As illustrated in FIG. 1, the upper separation regions US may extend in the X-direction between the separation regions MS adjacent to each other in the Y-direction in the first region R1. The upper separation regions US may be disposed to penetrate through some gate electrodes 130, including the uppermost upper gate electrodes 130S, among the gate electrodes 130. As illustrated in FIG. 2, the upper separation regions US may separate, for example, a total of three gate electrodes 130 from each other in the Y-direction. However, the number of gate electrodes 130 separated by the upper separation regions US may vary according to example embodiments. The upper separation region US may include an upper separation insulating layer 103. The upper separation insulating layer 103 may include an insulating material, for example, a silicon oxide, a silicon nitride, or a silicon oxynitride, but example embodiments are not limited thereto.

The contact plugs 170 may be disposed on the channel structures CH in the first region R1. The contact plugs 170 may have a cylindrical shape, and may have inclined side surfaces such that widths thereof are decreased in a direction toward the substrate 101 depending on an aspect ratio. The contact plugs 170 may electrically connect the channel structures CH to an upper interconnection structure such as bitlines. The contact plugs 170 may not be disposed on the alignment structure KC. The contact plugs 170 may be formed of a conductive material, and may include at least one of, for example, tungsten (W), aluminum (Al), and copper (Cu).

The cell region insulating layer 190 may be disposed to cover the first and second stack structures GS1 and GS2 and the first and second molding structures KS1 and KS2. In some example embodiments, the cell region insulating layer 190 may include a plurality of insulating layers. The cell region insulating layer 190 may be formed of an insulating material, and may include at least one of, for example, a silicon oxide, a silicon nitride, and a silicon oxynitride, but example embodiments are not limited thereto.

Figure 4:
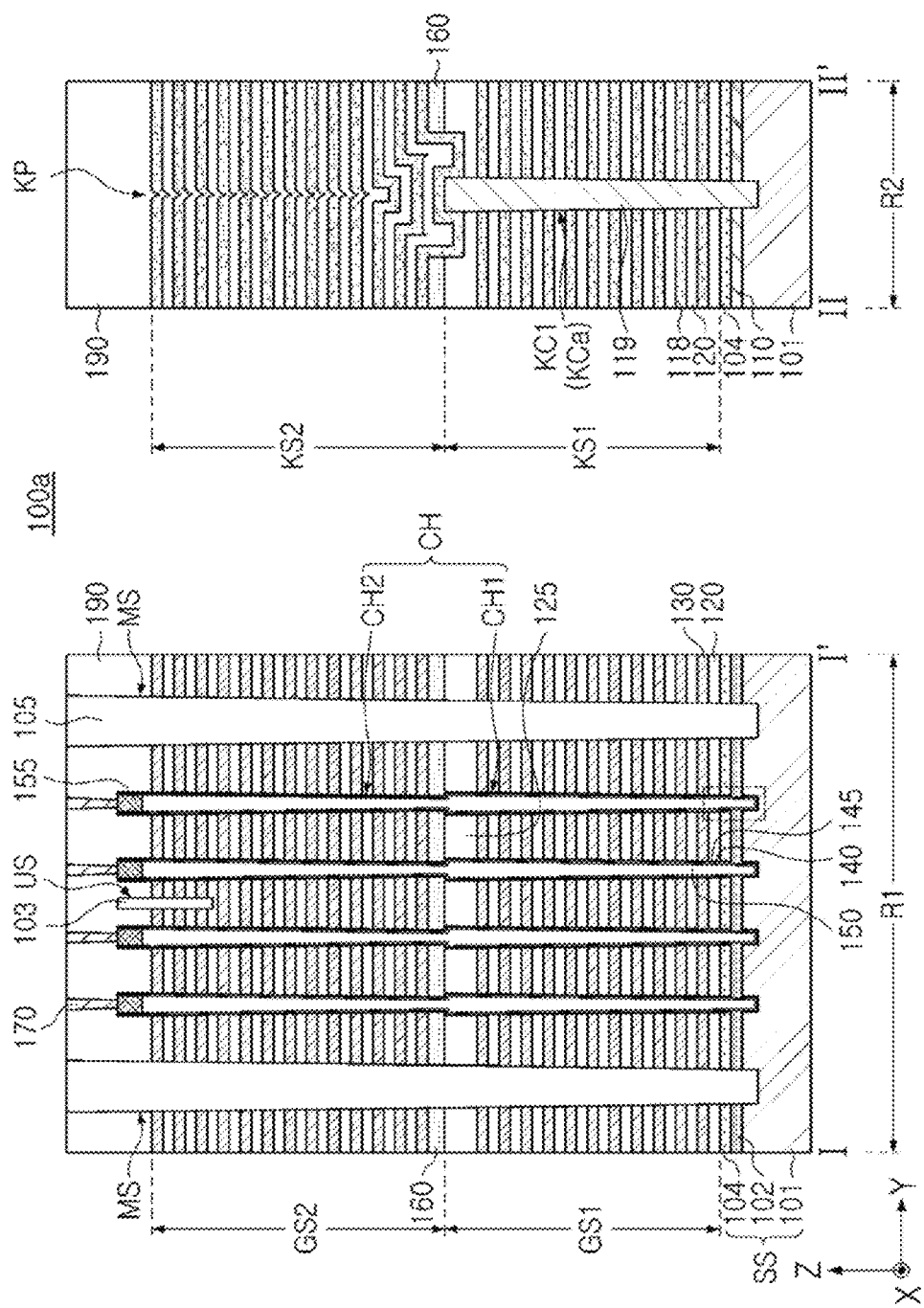
FIGS. 4, 5 and 6 are cross-sectional views of a semiconductor device according to some example embodiments.
Figure 5:
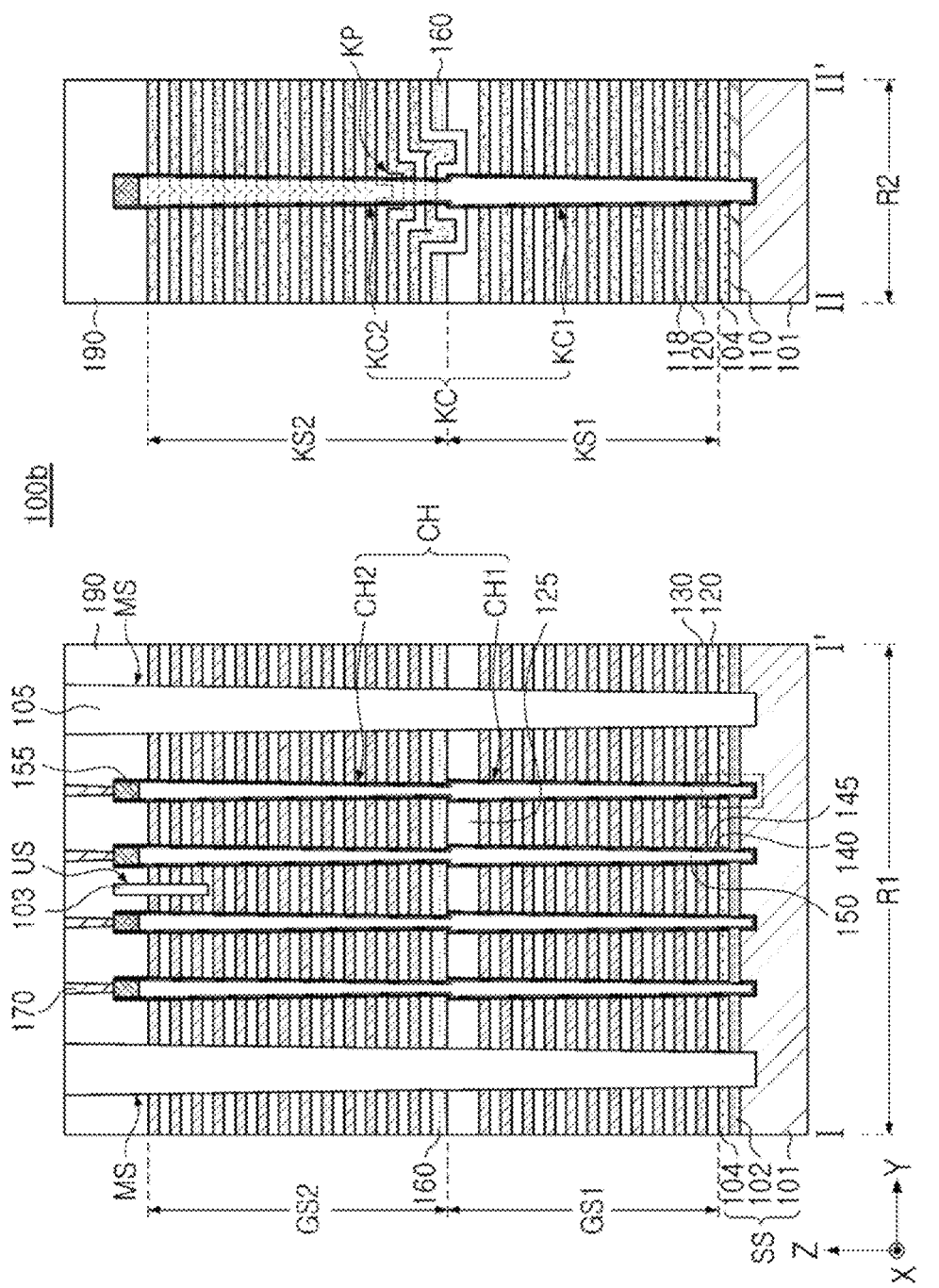
Figure 6:
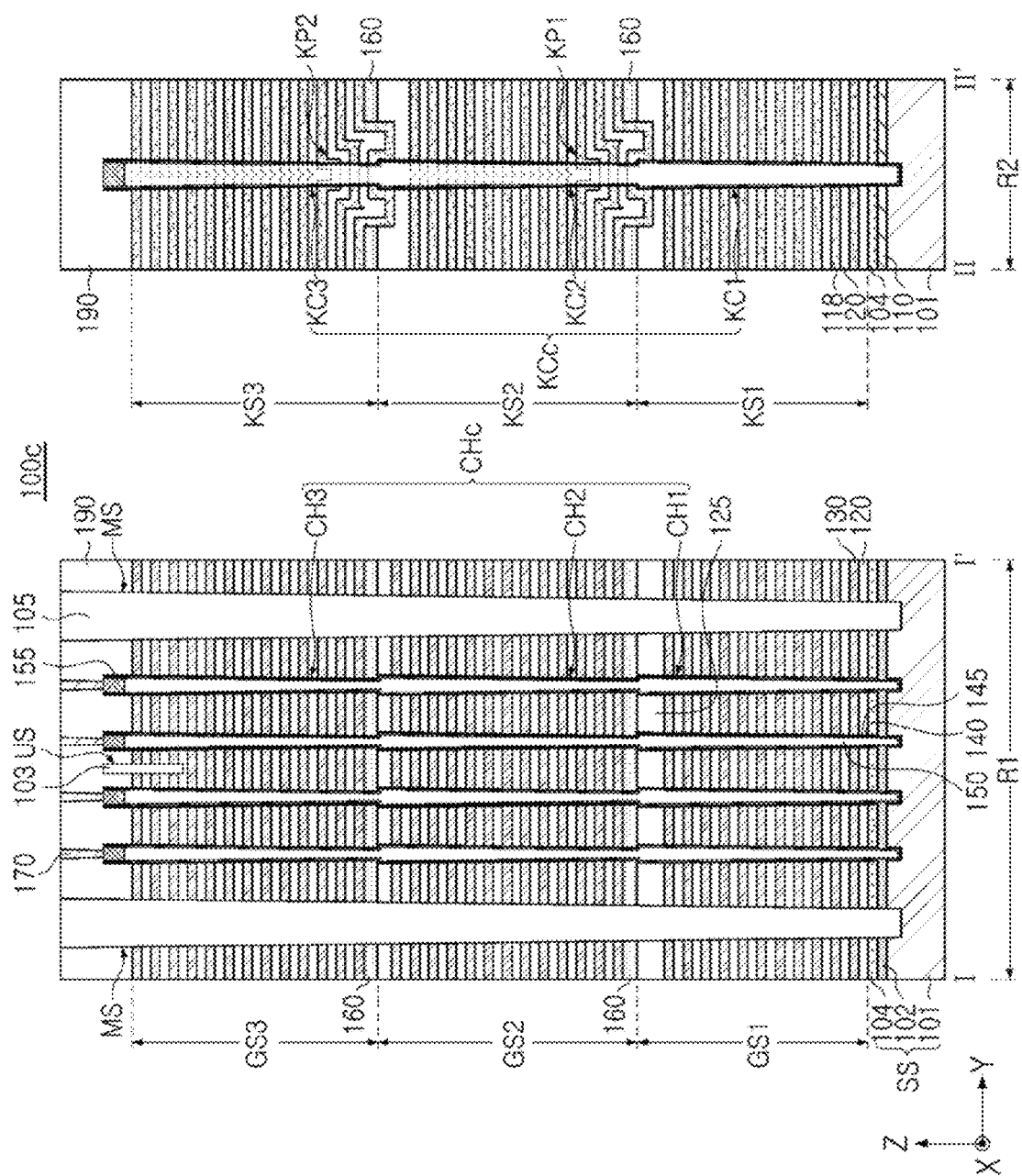

FIGS. 4 to 6 are cross-sectional views of a semiconductor device according to some example embodiments.

Referring to FIG. 4, a semiconductor device 100a may not include the second alignment structure KC2, unlike the example embodiment of FIGS. 1 to 3. Accordingly, an alignment structure KCa may include only a first alignment structure KC1 penetrating through a first molding structure KS1.

The first alignment structure KC1 may have an internal structure, different from that of a channel structure CH. The first alignment structure KC1 may include a vertical sacrificial layer 119. The vertical sacrificial layer 119 may include a carbon-based material, for example, may include an amorphous carbon layer (ACL), but a material of the vertical sacrificial layer 119 is not limited thereto.

In some example embodiments, the second molding structure KS2 may cover an entire or substantially all of an upper surface of the first alignment structure KC1. A horizontal sacrificial layers 118 and an interlayer insulating layers 120, constituting the second molding structure KS2, may each have a key pattern portion KP recessed or depressed toward a substrate 101. In each of the horizontal sacrificial layers 118 and the interlayer insulating layers 120, the key pattern portion KP may have a slightly different shape. The key pattern portion KP may have a bent shape gradually smoothed while being disposed toward the upper portion of the second molding structure KS2. For example, some layers including an uppermost horizontal sacrificial layer 118 and an uppermost interlayer insulating layer 120 may have a notch-shaped key pattern portion KP. In some example embodiments, the key pattern portion KP may have a shape of a notch formed on a periphery of the first alignment structure KC1 to correspond to the recessed portion RP (see FIG. 3), rather than a single notch shape illustrated in FIG. 4.

In some example embodiments, when a second alignment structure KC2 is omitted, the key pattern portion KP, instead of the second alignment structure KC2, may serve as an alignment key in a subsequent process.

Referring to FIG. 5, in a semiconductor device 100b, a second stack structure GS2 and a second molding structure KS2 may start with an interlayer insulating layer 120. Accordingly, the interlayer insulating layer 120 may cover an upper surface of a protective layer 160, and may cover a recessed region of a first molding structure KS1. In a second region R2, a lowermost layer of the second molding structure KS2, extending on the first molding structure KS1 to constitute a recessed portion RP (see FIG. 3), may be the interlayer insulating layer 120. The lowermost interlayer insulating layer 120 may cover an upper surface and a side surface of a first alignment structure KC1 and may be in contact with the first alignment structure KC1.

Referring to FIG. 6, a semiconductor device 100c may further include a third stack structure GS3 and a third molding structure KS3. A channel structure CHc may further include a third channel structure CH3, and an alignment structure KCc may further include a third alignment structure KC3. A second molding structure KS2 may have a first key pattern portion KP1, and a third molding structure KS3 may have a second key pattern portion KP2.

In the channel structure CHc, a third channel structure CH3 may be connected to a second channel structure CH2, and may include a channel pad 155 disposed on an upper end thereof. In the alignment structure KCc, the third alignment structure KC3 may be connected to a second alignment structure KC2. The description of the key pattern portion KP, provided with reference to FIGS. 1 to 3, may be equally applied to each of a first key pattern portion KP1 and a second key pattern portion KP2.

As described above, the number of stack structures and molding structures stacked in a Z-direction may vary according to various example embodiments. Accordingly, a shape of the key pattern portion may also vary.

Figure 7:
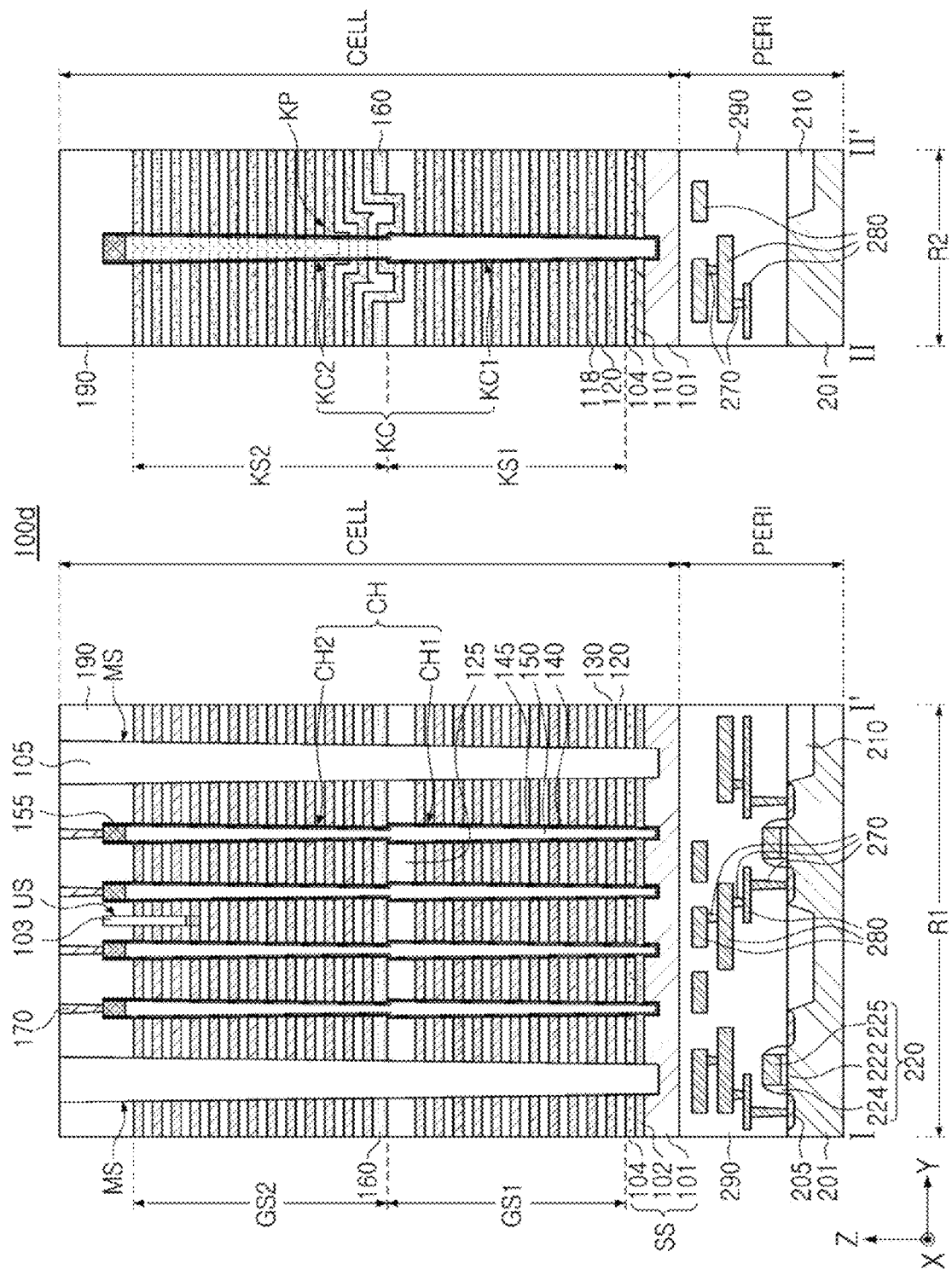
FIG. 7 is a schematic cross-sectional view of a semiconductor device according to some example embodiments.

FIG. 7 is a schematic cross-sectional view of a semiconductor device according to some example embodiments.

Referring to FIG. 7, a semiconductor device 100d may include a memory cell region CELL and a peripheral circuit region PERI, stacked vertically. The memory cell region CELL may be disposed on the peripheral circuit region PERI. For example, in the case of the semiconductor device 100 of FIG. 2, the peripheral circuit region PERI may be disposed on the substrate 101 in a region, not illustrated. Alternatively, the peripheral circuit region PERI may be disposed below the substrate 101, as in the semiconductor device 100d according to FIG. 7. In some example embodiments, the cell region CELL may be disposed below the peripheral circuit region PERI. The description, provided with reference to FIGS. 1 to 3, may be equally applied to the description of the memory cell region CELL.

The peripheral circuit region PERI may include a base substrate 201, circuit devices 220 disposed on the base substrate 201, circuit contact plugs 270, and circuit interconnection lines 280.

The base substrate 201 may have an upper surface extending in an X-direction and a Y-direction. In the base substrate 201, isolation layers 210 may be formed to define active regions. Source/drain regions 205 including impurities may be disposed in a portion of the active region. The base substrate 201 may include a semiconductor material, for example, a group IV semiconductor, a group III-V compound semiconductor, or a group II-VI compound semiconductor, but example embodiments are not limited thereto. The base substrate 201 may be provided as a bulk wafer, an epitaxial layer, etc. In the some example embodiments, an overlying substrate 101 may be provided as a polycrystalline semiconductor layer, such as a polycrystalline silicon layer, or an epitaxial layer, but example embodiments are not limited to.

The circuit devices 220 may include planar transistors. Each of the circuit devices 220 may include a circuit gate dielectric layer 222, a spacer layer 224, and a circuit gate electrode 225. Source/drain regions 205 may be disposed in the base substrate 201 on opposite sides adjacent to the circuit gate electrode 225.

A peripheral region insulating layer 290 may be disposed on the circuit device 220 on the base substrate 201. The circuit contact plugs 270 may penetrate through the peripheral region insulating layer 290 to be connected to the source/drain regions 205. An electrical signal may be applied to the circuit device 220 by the circuit contact plugs 270. In a region, not illustrated, the circuit contact plugs 270 may also be connected to the circuit gate electrode 225. The circuit interconnection lines 280 may be connected to the circuit contact plugs 270 and may be disposed as a plurality of layers. In the peripheral circuit region PERI, the circuit device 220 may not be disposed below the second region R2, but example embodiments are not limited thereto.

In the semiconductor device 100d, a peripheral circuit region PERI may be formed, and a substrate 101 of a memory cell region CELL may then be formed on the peripheral circuit region PERI to form the memory cell region CELL. The substrate 101 may have the same or substantially the same size as the base substrate 201 or may be formed to be smaller than the base substrate 201. The memory cell region CELL and the peripheral circuit region PERI may be connected to each other in a region, not illustrated. For example, one end of the gate electrode 130 in an X-direction may be electrically connected to the circuit devices 220. Such a shape, in which the memory cell region CELL and the peripheral circuit region PERI are vertically stacked, may also be applied to the example embodiments of FIGS. 1 to 6.

Figure 8A:
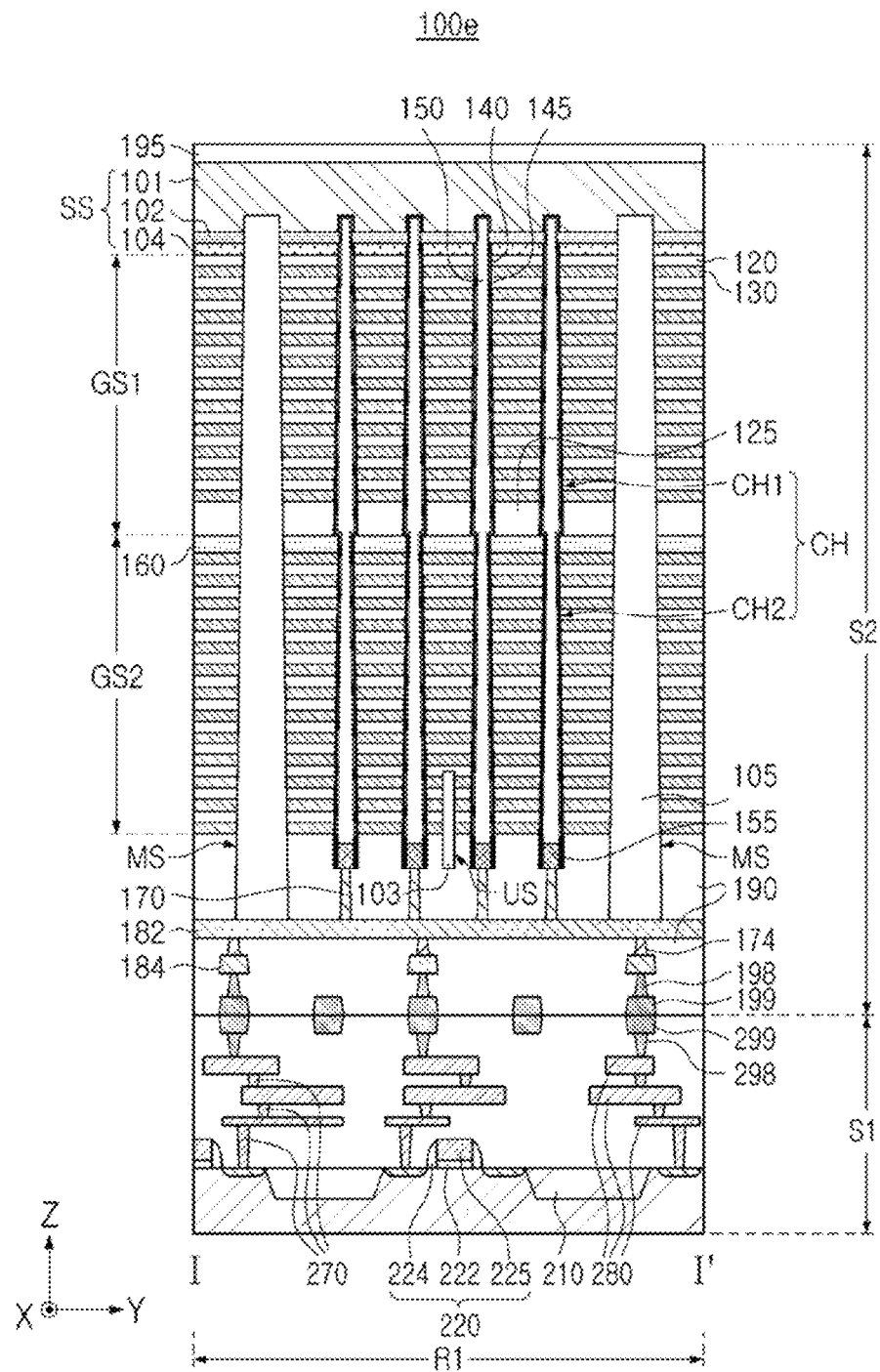
FIGS. 8A and 8B are schematic cross-sectional views of a semiconductor device according to some example embodiments.
Figure 8B:
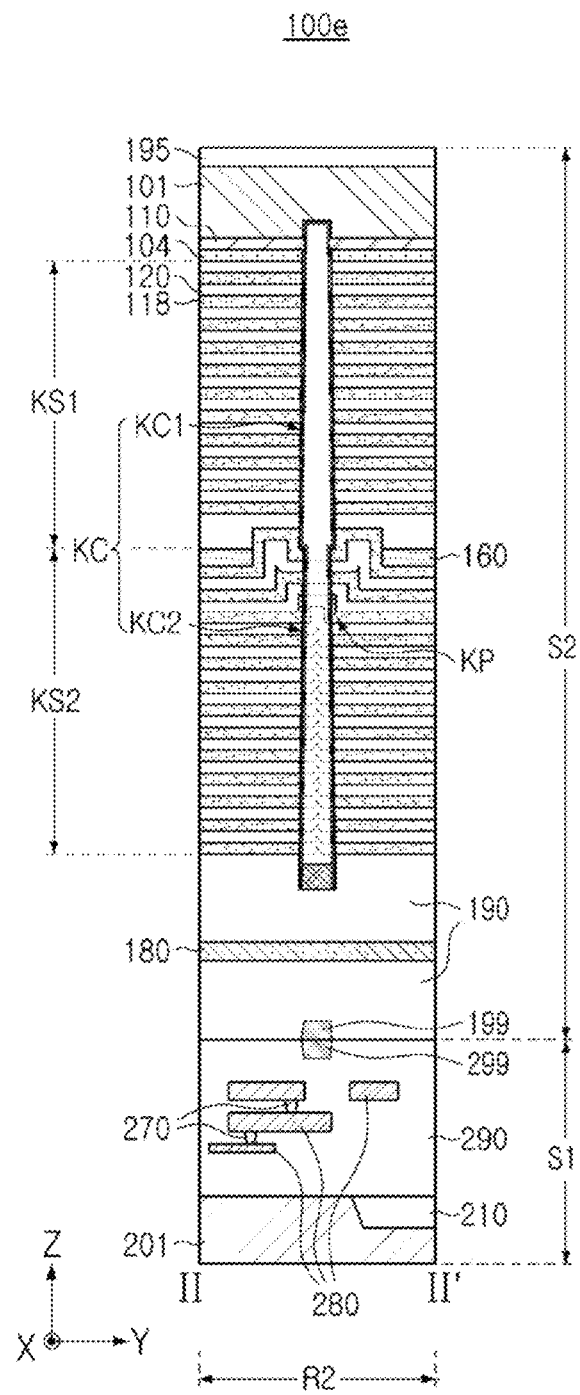

FIGS. 8A and 8B are schematic cross-sectional views of a semiconductor device according to some example embodiments.

Referring to FIGS. 8A and 8B, a semiconductor device 100e may include a first semiconductor structure S1 and a second semiconductor structure S2 bonded by wafer bonding.

The description of the peripheral circuit region PERI, provided with reference to FIG. 7, may be applied to the first semiconductor structure S1. However, the first semiconductor structure S1 may further include first bonding vias 298 and first bonding pads 299, bonding structures. The first bonding vias 298 may be disposed on uppermost circuit interconnection lines 280 to be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 may provide an electrical connection path according to the bonding between the first semiconductor structure S1 and the second semiconductor structure S2, together with the second bonding pads 199. The first bonding vias 298 and the first bonding pads 299 may include a conductive material, for example, copper (Cu).

The descriptions provided with reference to FIGS. 1 to 3 may be equally applied to the second semiconductor structure S2, unless otherwise specified. The second semiconductor structure S2 may further include lower contact plugs 174 and first and second cell interconnection lines 182 and 184, an interconnection structure, and may further include second bonding vias 198 and second bonding pads 199, a bonding structure. The second semiconductor structure S2 may further include a passivation layer 195 covering an upper surface of the substrate 101.

The first cell interconnection lines 182 may be connected to the contact plugs 170, and the second cell interconnection lines 184 may be electrically connected to the first cell interconnection lines 182 by the lower contact plugs 174. The lower contact plugs 174 may be disposed between the first and second cell interconnection lines 182 and 184, and may connect the first and second cell interconnection lines 182 and 184 to each other. However, the number of layers and the disposition form of the contact plugs and interconnection lines constituting an interconnection structure may vary according to various example embodiments. The lower contact plugs 174 and the first and second cell interconnection lines 182 and 184 may be formed of a conductive material, and may include at least one of, for example, tungsten (W), aluminum (Al), and copper (Cu), but example embodiments are not limited thereto.

The second bonding vias 198 and the second bonding pads 199 may be disposed below lowermost second cell interconnection lines 184. The second bonding vias 198 may be connected to the second cell interconnection lines 184 and the second bonding pads 199, and the second bonding pads 199 may be connected to the first bonding pads 299 of the first semiconductor structure S1. The second bonding vias 198 and the second bonding pads 199 may include a conductive material, for example, copper (Cu).

The first semiconductor structure S1 and the second semiconductor structure S2 may be bonded by copper-to-copper (Cu-to-Cu) bonding performed by bonding the first bonding pads 299 and the second bonding pads 199 to each other. In addition to the copper-to-copper (Cu-to-Cu) bonding, the first semiconductor structure S1 and the second semiconductor structure S2 may be additionally bonded by dielectric-to-dielectric bonding. The dielectric-to-dielectric bonding may be bonding performed by dielectric layers, constituting a portion of each of the peripheral region insulating layer 290 and the cell region insulating layer 190 and respectively surrounding the first bonding pads 299 and the second bonding pads 199. Accordingly, the first semiconductor structure S1 and the second semiconductor structure S2 may be bonded without an additional adhesive layer.

FIGS. 9A to 9I are schematic cross-sectional view illustrating a method of fabricating a semiconductor device according to some example embodiments. FIGS. 9A to 9I illustrate cross-sections corresponding to FIG. 2.

Figure 9A:
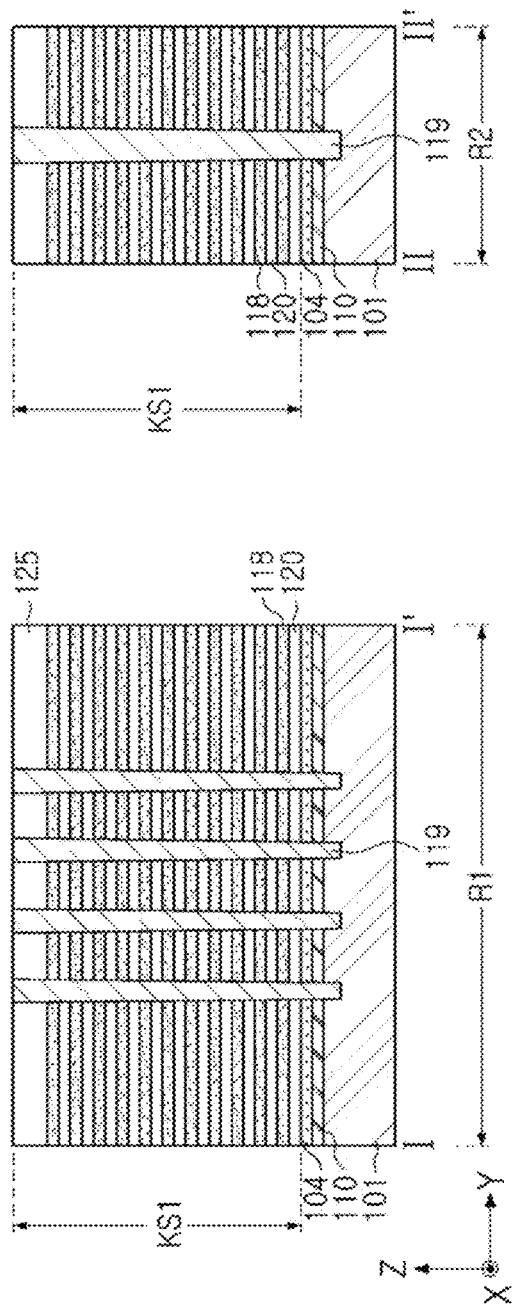
FIGS. 9A, 9B, 9C, 9D, 9E, 9F, 9G, 9H, and 9I are schematic cross-sectional view illustrating a method of fabricating a semiconductor device according to some example embodiments.
Figure 9B:
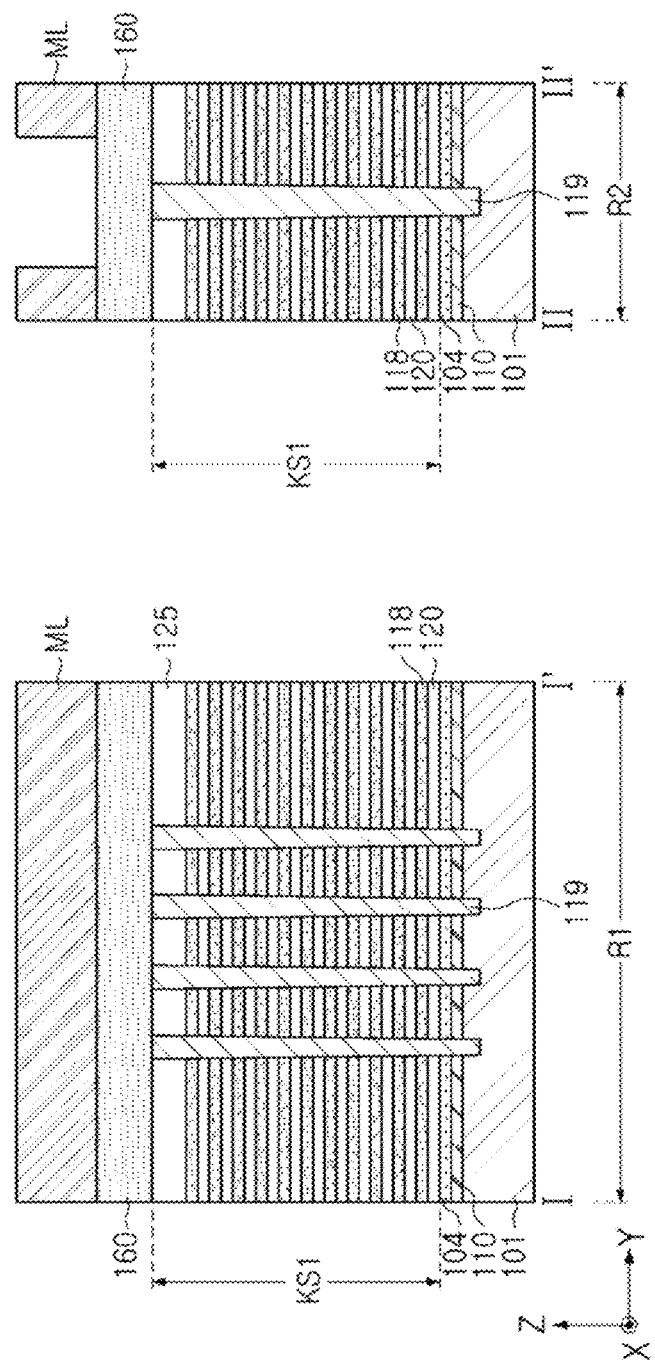
Figure 9C:
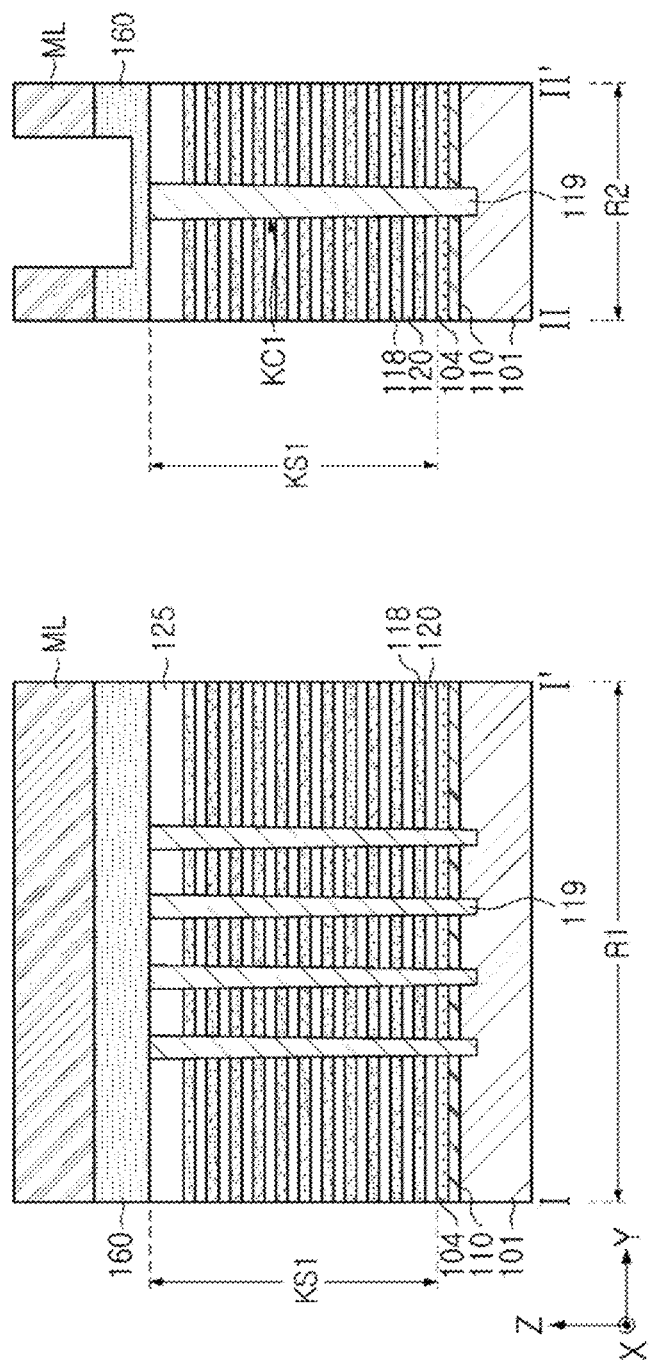
Figure 9D:
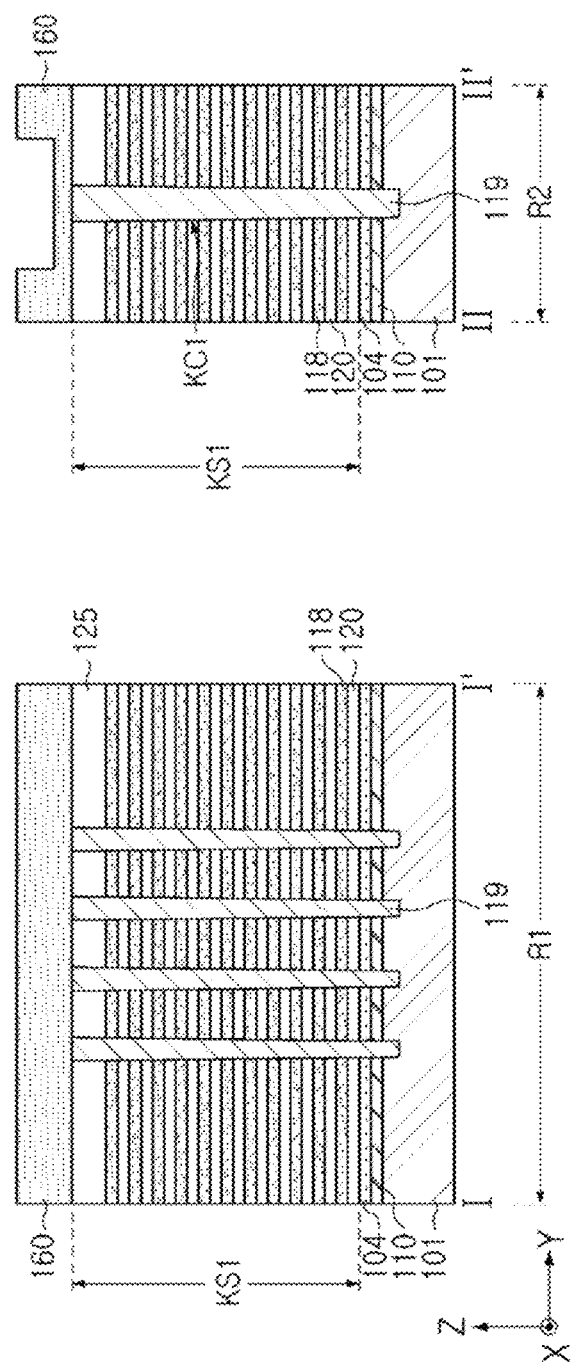
Figure 9E:
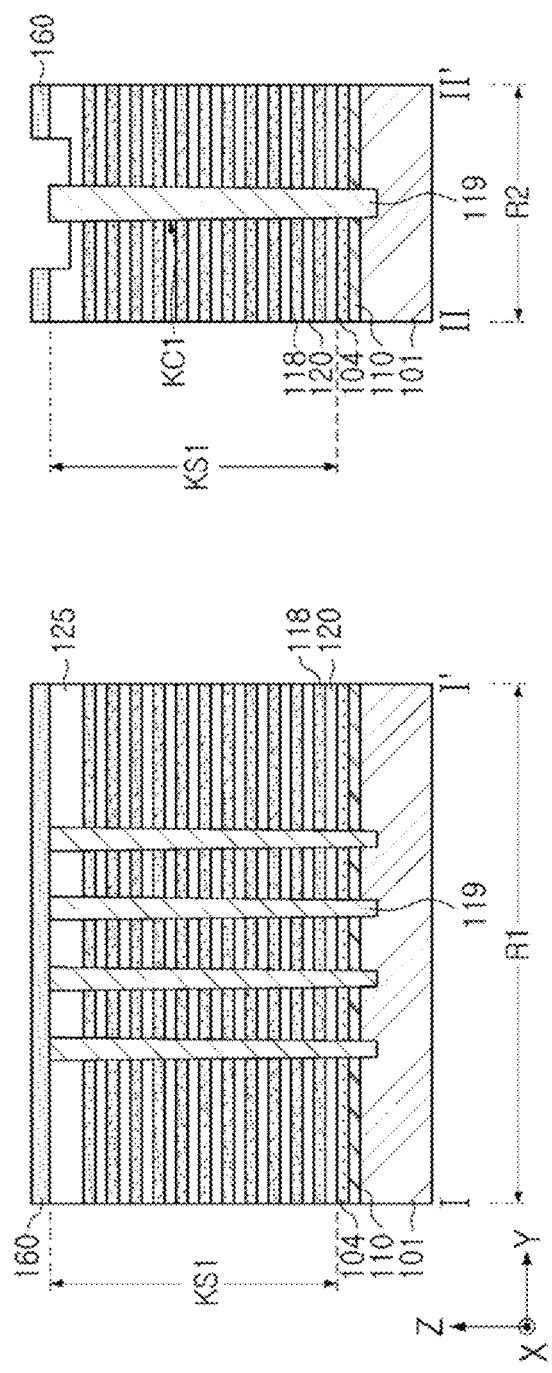
Figure 9F:
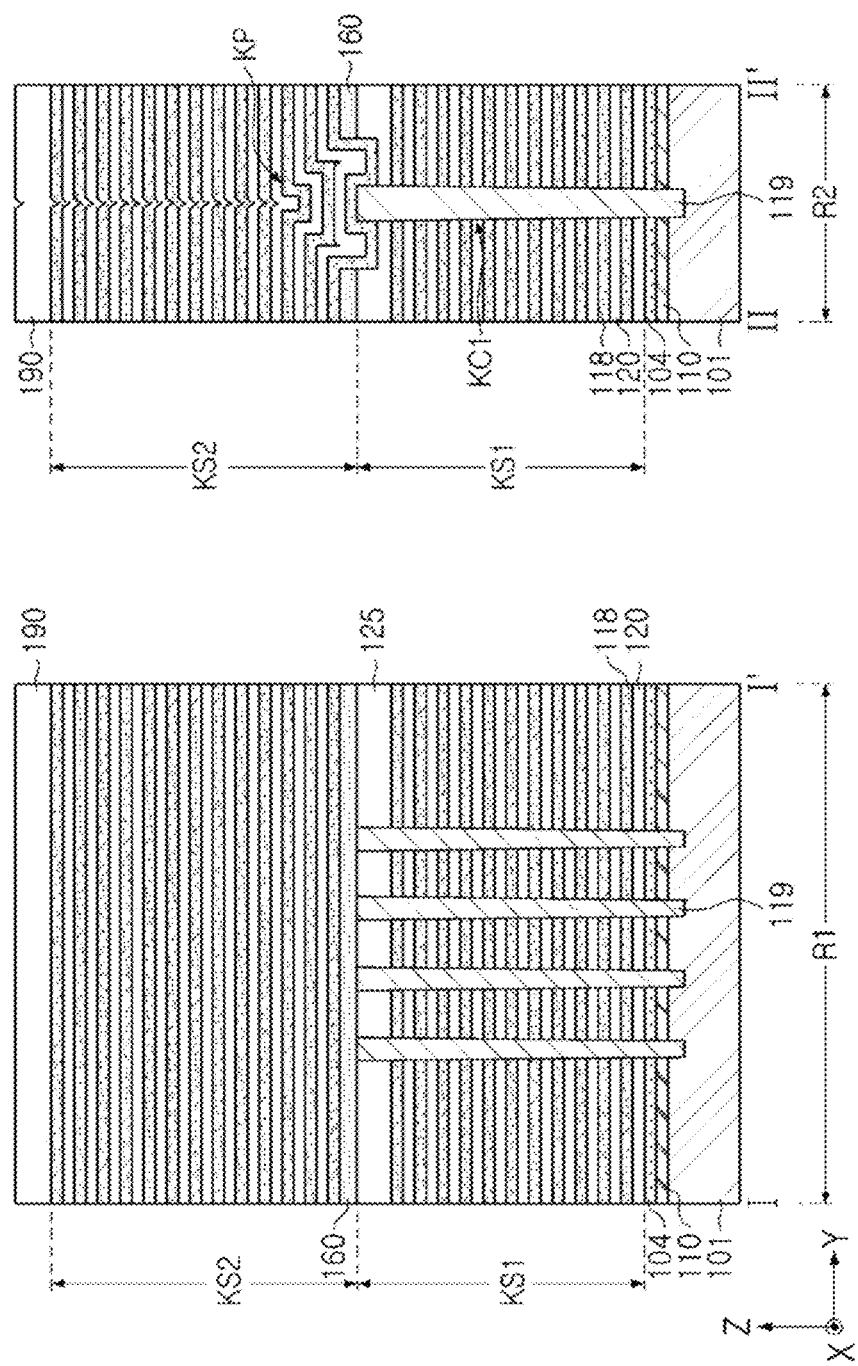
Figure 10:
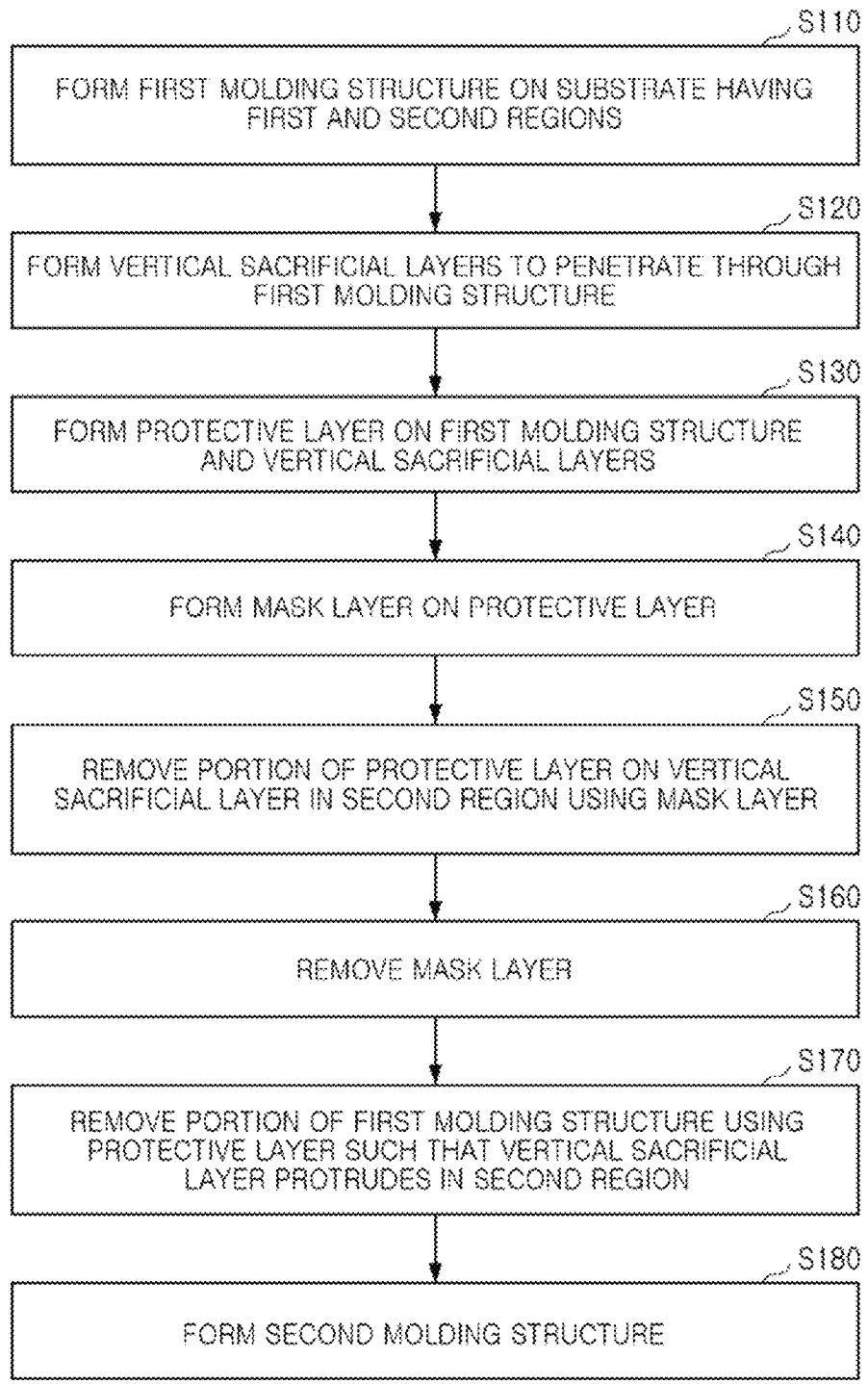
FIG. 10 is a flowchart illustrating a method of fabricating a semiconductor device according to some example embodiments.

FIG. 10 is a flowchart illustrating a method of fabricating a semiconductor device according to some example embodiments. FIG. 10 illustrates process operations of FIGS. 9A to 9F.

Referring to FIGS. 9A and 10, in operation S110, a first molding structure KS1 may be formed by forming a horizontal sacrificial layer 118 and a second horizontal conductive layer 104 on a substrate 101 and alternately stacking horizontal sacrificial layers 118 and interlayer insulating layers 120. In operation S120, vertical sacrificial layers 119 may be formed to penetrate through the first molding structure KS1.

The substrate 101 may have a first region R1, in which memory cells are to be formed, and a second region R2 outside the first region R1. In the present operation, the same process may be performed on the first and second regions R1 and R2.

The horizontal sacrificial layer 118 may include a plurality of layers including different materials. The horizontal sacrificial layer 118 may be layers replaced with the first horizontal conductive layer 102 (see FIG. 2) through a subsequent process. For example, the horizontal sacrificial layer 118 may include a first layer and a third layer formed of the same or substantially the same material as the interlayer insulating layers 120, and may further include a second layer formed of the same or substantially the same material as the horizontal sacrificial layers 118 and disposed between the layer and the third layer. The second horizontal conductive layer 104 may be formed on the horizontal sacrificial layer 118.

In the first molding structure KS1, the horizontal sacrificial layers 118 may be replaced by the gate electrodes 130 (see FIG. 2) in the first region R1 through a subsequent process. The horizontal sacrificial layers 118 may include a material, different from a material of the interlayer insulating layers 120, and may be formed of a material which may be etched with etching selectivity with respect to the interlayer insulating layers 120 under a specific etching condition. For example, the interlayer insulating layer 120 may include at least one of a silicon oxide and a silicon nitride, and the horizontal sacrificial layers 118 include a material, selected from the group consisting of silicon, silicon oxide, silicon carbide, and silicon nitride, different from the material of the interlayer insulating layer 120, but example embodiments are not limited thereto. In some example embodiments, the interlayer insulating layers 120 may not have the same thickness. A relatively thick upper interlayer insulating layer 125 may be formed in an uppermost portion of the first molding structure KS1. In example embodiments, the thicknesses and the number of layers of the interlayer insulating layers 120 and the sacrificial insulating layers 118 may be variously modified from what is illustrated in the drawings.

The vertical sacrificial layers 119 may be formed in a region corresponding to the first channel structures CH1 and the first alignment structure KC1 of FIG. 2. The vertical sacrificial layers 119 may be formed by forming lower channel holes to penetrate through the first molding structure KS1, depositing a material forming the vertical sacrificial layers 119 in the lower channel holes, and performing a planarization process. The vertical sacrificial layers 119 may include a carbon-based material, for example, an amorphous carbon layer (ACL). In some example embodiments, the vertical sacrificial layers 119 may include a semiconductor material such as polycrystalline silicon or a silicon-based insulating material, but example embodiments are not limited thereto.

Referring to FIGS. 9B and 10, in operation S130, a protective layer 160 may be formed on the first molding structure KS1 and the vertical sacrificial layers 119 and in operation S140, a mask layer ML may be formed on a portion of the protective layer 160.

The passivation layer 160 may include an insulating material, for example, tetraethyl orthosilicate (TEOS) oxide or high density plasma (HDP) oxide, but example embodiments are not limited thereto. A thickness of the protective layer 160 may be determined in consideration of a thickness at which the first molding structure KS1 is recessed in a subsequent process.

The mask layer ML may be, for example, a photoresist layer. The mask layer ML may be patterned to expose a portion of the passivation layer 160 in the second region R2. For example, the mask layer ML may be formed to expose the passivation layer 160 on the vertical sacrificial layer 119 in the second region R2.

Referring to FIGS. 9C and 10, in operation S150, a portion of the protective layer 160 exposed by the mask layer ML in the second region R2 may be removed.

The protective layer 160 may be removed from an upper surface thereof by a desired (or, alternatively predetermined) thickness using a wet etching or a dry etching process. In the present operation, the removal thickness of the passivation layer 160 may be controlled such that the passivation layer 160 remains on the vertical sacrificial layer 119 in the second region R2.

Referring to FIGS. 9D and 10, in operation S160, the mask layer ML may be removed.

The mask layer ML may be removed by an ashing process and a stripping process. In the present operation, the mask layer ML may be removed in a state in which the vertical sacrificial layers 119 are not exposed. Accordingly, even when the vertical sacrificial layers 119 are formed of a carbon-based material, the vertical sacrificial layers 119 may be protected without being damaged because the protective layer 160 covers the vertical sacrificial layers 119.

Referring to FIGS. 9E and 10, in operation S170, a portion of the first molding structure KS1 may be removed using the passivation layer 160 to expose the vertical sacrificial layer 119 in the second region R2.

An etching process may be performed such that a portion of the upper interlayer insulating layer 125 is removed to expose an upper end of the vertical sacrificial layer 119 in the second region R2. The present operation may be performed using a step of the protective layer 160 without an additional mask layer. Accordingly, the first molding structure KS1 may be recessed in the region in which the mask layer ML was not formed in the operation of FIG. 9B, and the protective layer 160 may remain in the region in which the mask layer ML was formed. A thickness of the remaining protective layer 160 may vary according to various example embodiments.

The region, in which the first molding structure KS1 is recessed, may be a region of a periphery of the vertical sacrificial layer 119 in the second region R2. A width and a depth of the first molding structure KS1 recessed along the periphery of the vertical sacrificial layer 119 may vary according to various example embodiments.

Referring to FIGS. 9F and 10, in operation S180, the second molding structure KS2 may be formed by alternately stacking horizontal sacrificial layers 118 and interlayer insulating layers 120 on the protective layer 160.

Similarly to the first molding structure KS1, the second molding structure KS2 may be formed by alternately stacking the horizontal sacrificial layers 118 and the interlayer insulating layers 120. In the second region R2, a recessed portion RP (see FIG. 3) may be formed on the region in which the first molding structure KS1 is recessed, and a shape of the recessed portion RP may be gradually smoothed upwardly. Accordingly, notch portions may be formed in upper layers, including uppermost layers, of the horizontal sacrificial layers 118 and the interlayer insulating layers 120. Downwardly recessed regions, such as the recessed portion RP and the notch portion, may constitute key pattern portions KP. In the upper layers, the key pattern portion KP may be mainly formed due to a difference between a level of an upper surface of the vertical sacrificial layer 119 and a level of an upper surface of the protective layer 160. For example, the notch portion may be formed in a region corresponding to a center of the vertical sacrificial layer 119.

A portion of the cell region insulating layer 190 may be formed on the second molding structure KS2. The cell region insulating layer 190 may also have the notch portion constituting the key pattern portion KP on an upper surface thereof. According to a manner of description, a portion of the cell region insulating layer 190 formed in the present operation may be described as the interlayer insulating layer 120 included in the second molding structure KS2.

Figure 9G:
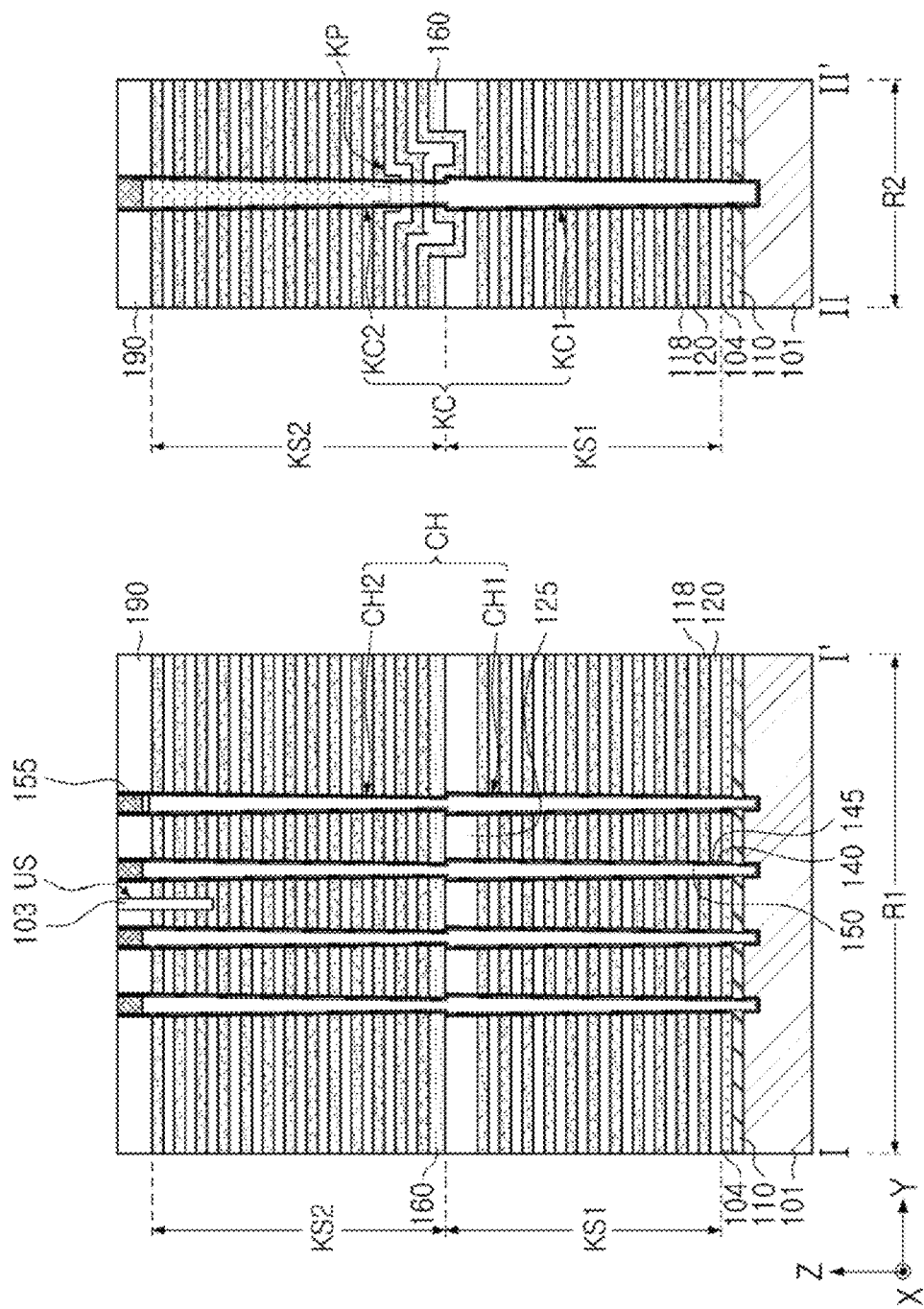

Referring to FIG. 9G, after forming upper channel holes penetrating through the second molding structure KS2 and removing the vertical sacrificial layers 119 through the upper channel holes, channel structures CH and an alignment structure KC may be formed.

A portion of the second molding structure KS2 may be removed to form the upper separation region US. To form the upper separation region US, a region, in which the upper separation region US is to be formed, may be exposed using an additional mask layer, a desired (or, alternatively predetermined) number of horizontal sacrificial layers 118 and interlayer insulating layers 120 may be removed from an uppermost portion, and an insulating material may then be deposited to form an upper separation insulating layer 103.

Next, upper channel holes may be formed on the vertical sacrificial layers 119 to expose upper surfaces of the vertical sacrificial layers 119. In the present operation, the key pattern portion KP may function as an alignment key during a photolithography process of forming the upper channel holes. In subsequent operations, the alignment structure KC may function as an alignment key. In some example embodiments, when the forming the upper channel holes and the forming the channel structures CH and the alignment structure KC are not successively performed, filling the upper channel holes with vertical sacrificial layers may be further performed.

Next, the vertical sacrificial layers 119 may be removed to form channel holes, and the channel holes may then be filled to form the channel structures CH and the alignment structure KC. For example, a gate dielectric layer 145, a channel layer 140, a channel buried insulating layer 150, and channel pads 155 may be sequentially formed in the channel holes to form the channel structures CH and the alignment structure KC. The channel layer 140 may be formed on the gate dielectric layer 145 in the channel structures CH. The channel buried insulating layer 150 may be formed to fill the channel structures CH and the alignment structure KC, and may include an insulating material. In some example embodiments, a space between the channel layers 140 may be filled with a conductive material, rather than the channel buried insulating layer 150. The channel pads 155 may be formed of a conductive material, for example, polycrystalline silicon. As described above, since the channel structures CH and the alignment structure KC are formed together in the present operation, the channel structures CH and the alignment structure KC may have the same internal structure.

Figure 9H:
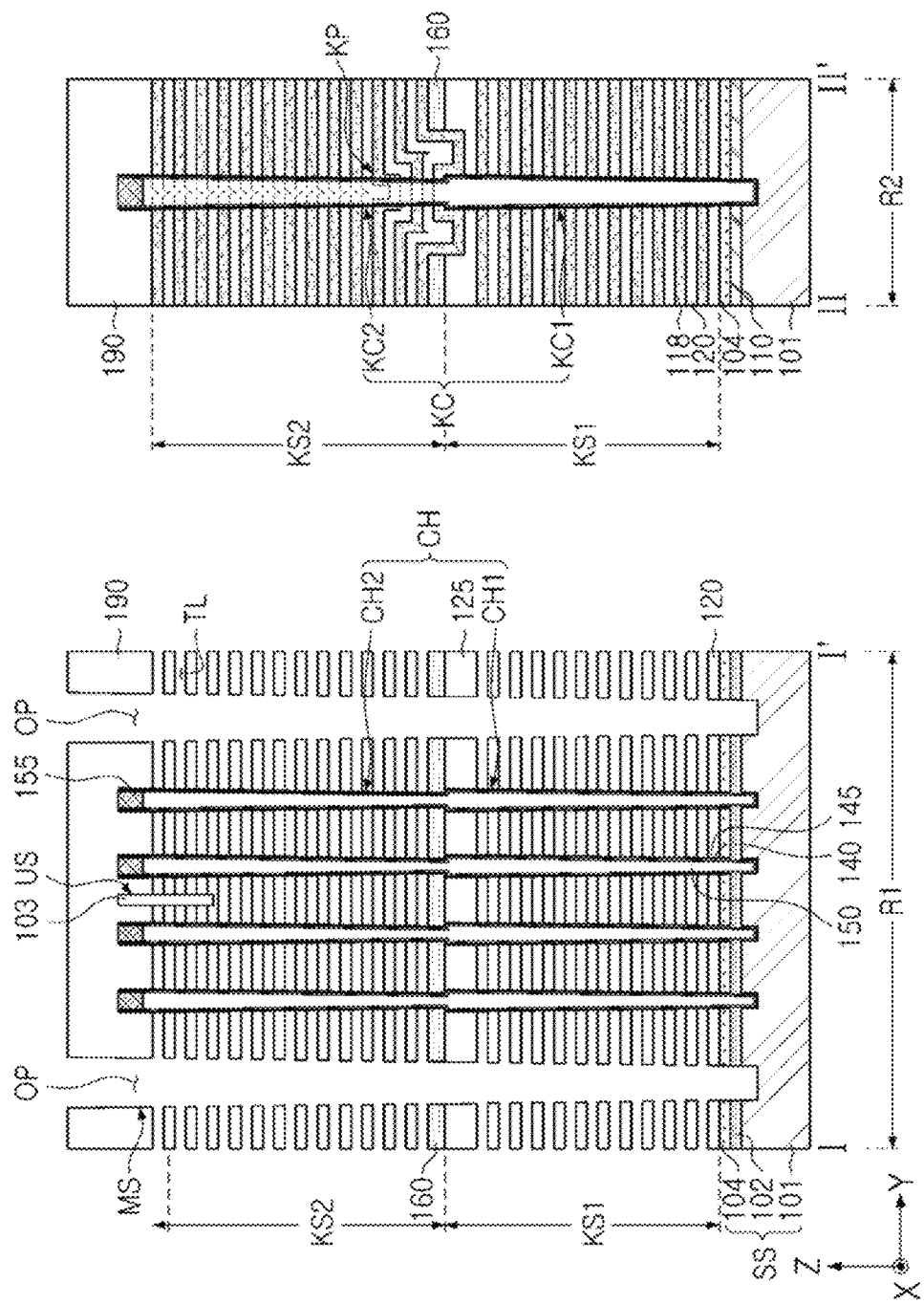

Referring to FIG. 9H, in the first region R1, openings OP may be formed to extend to the substrate 101 through the first and second molding structures KS1 and KS2, a first horizontal conductive layer 102 may be formed, and horizontal sacrificial layers 118 may then be removed.

A cell region insulating layer 190 may be further formed, and openings OP may be formed in positions corresponding to the separation regions MS (see FIG. 1) in the first region R1. Then, an etch-back process may be performed while forming additional sacrificial spacer layers in the openings OP, to expose the horizontal insulating layer 110 in the first region R1 and to remove the horizontal insulating layer from the exposed region. The horizontal insulating layer 110 may be removed by, for example, a wet etching process. A portion of the gate dielectric layer 145, exposed in the region in which the horizontal insulating layer 110 is removed, may also be removed during the process of removing the horizontal insulating layer 110. In the first region R1, the first horizontal conductive layer 102 may be formed by depositing a conductive material in the region in which the horizontal insulating layer 110 has been removed, and the sacrificial spacer layers may then be removed in the openings OP. By the present process, the first horizontal conductive layer 102 may be formed in the first region R1, and a source structure SS including the substrate 101 and the first and second horizontal conductive layers 102 and 104 may be formed.

Then, the horizontal sacrificial layers 118 may be selectively etched with respect to the interlayer insulating layers 120, the upper interlayer insulating layer 125, the protective layer 160, and the second horizontal conductive layer 104 using, for example, wet etching to form tunnel portions TL.

In the present operation, the openings OP may not be formed in the second region R2, so that the horizontal insulating layer 110 and the horizontal sacrificial layers 118 may remain.

Figure 9I:
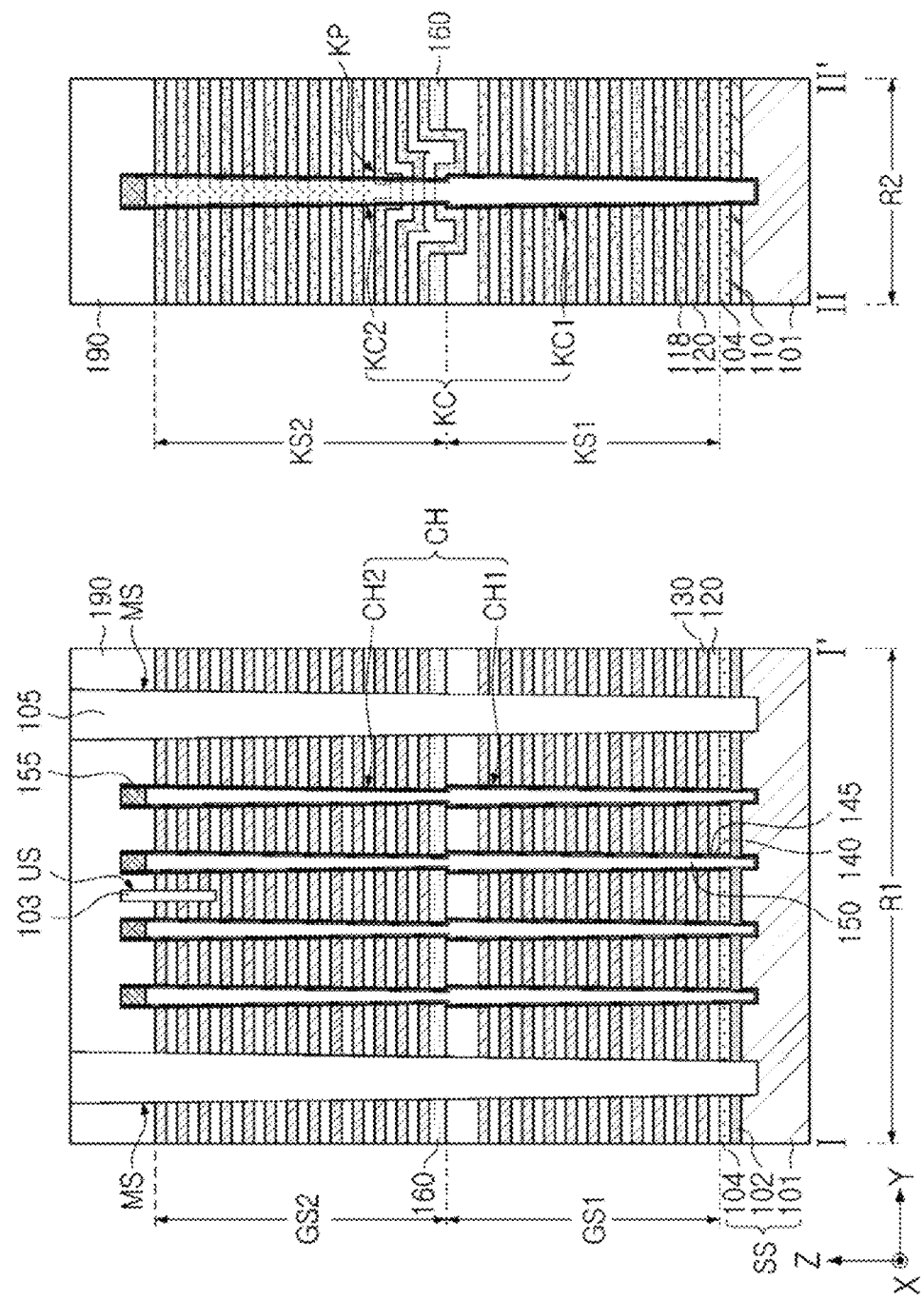

Referring to FIG. 9I, in the first region R1, gate electrodes 130 may be formed in the tunnel portions TL, and a separation insulating layer 105 may be formed in the openings OP.

In the first region R1, the gate electrodes 130 may be formed in the tunnel portions TL in which the horizontal sacrificial layers 118 have been removed. Thus, first and second stack structures GS1 and GS2 including the gate electrodes 130 may be formed in the first region R1. When a portion of the gate dielectric layer 145 extends horizontally along the gate electrodes 130, a portion of the gate dielectric layer 145 may be formed ahead of the gate electrodes 130 in the present operation. The conductive material of the gate electrodes 130 may include, for example, a metal, polycrystalline silicon, or a metal silicide material, but example embodiments are not limited thereto.

After the gate electrodes 130 are formed, a separation insulating layer 105 may be formed in the openings OP to form separation regions MS.

Then, referring to FIG. 2, contact plugs 170 connected to the channel structures CH in the first region R1 may be formed to fabricate the semiconductor device 100. Although not illustrated, interconnection structures such as interconnection lines may be further formed on the contact plugs 170.

Figure 11:
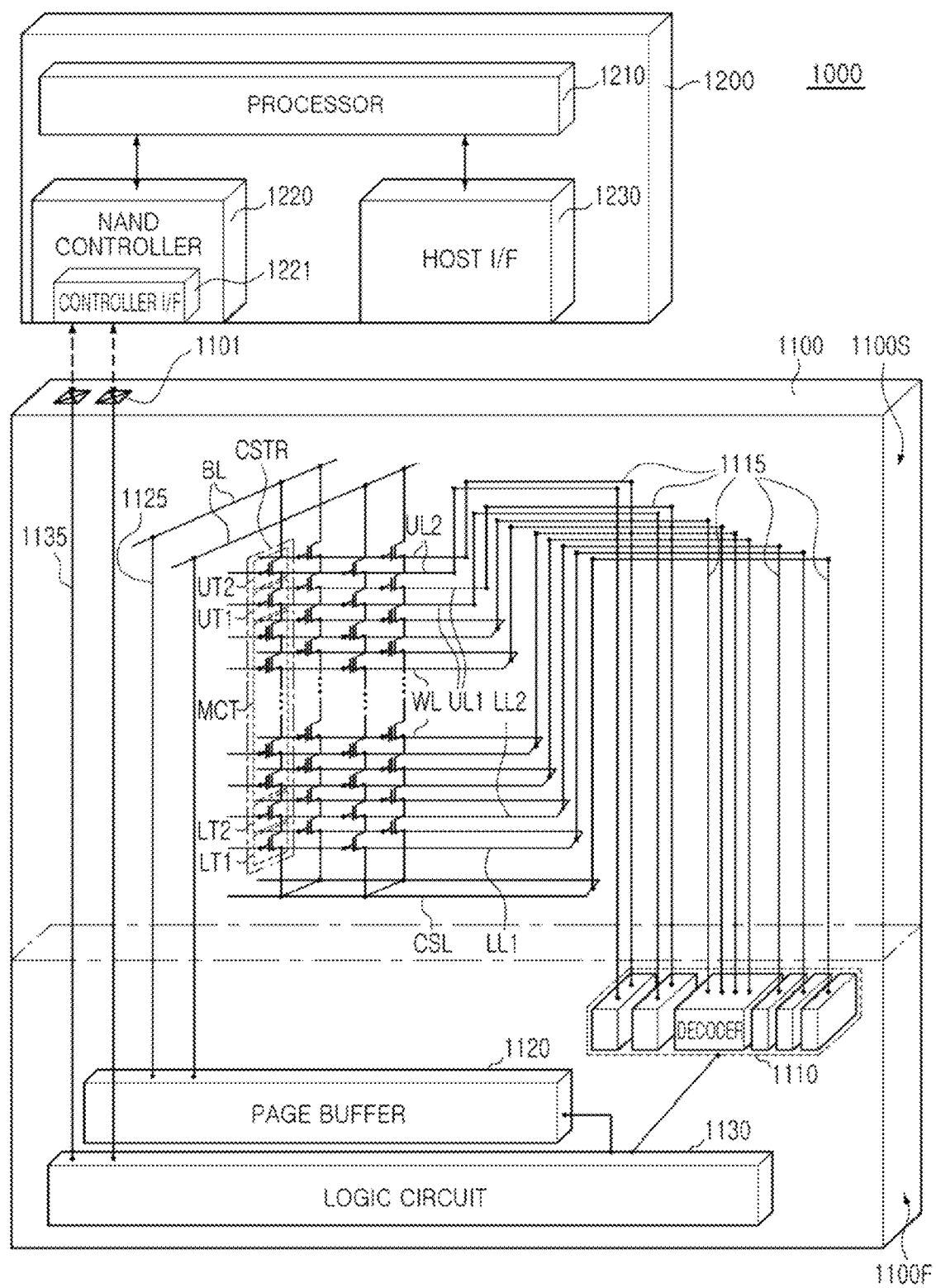
FIG. 11 is a schematic view of a data storage system including a semiconductor device according to some example embodiments.

FIG. 11 is a schematic view of a data storage system including a semiconductor device according to some example embodiments.

Referring to FIG. 11 a data storage system 1000 may include a semiconductor device 1100 and a controller 1200 electrically connected to the semiconductor device 1100. The data storage system 1000 may be a storage device, including one or more semiconductor devices 1100, or an electronic device including a storage device. For example, the data storage system 1000 may be or include a solid state drive (SSD) device including one or more semiconductor devices 1100, a universal serial bus (USB), a computing system, a medical device, or a communications device.

The semiconductor device 1100 may be or include a nonvolatile memory device and may be, for example, the NAND flash memory device described with reference to FIGS. 1 to 8B. The semiconductor device 1100 may include a first structure 1100F and a second structure 1100S on the first structure 1100F. In some example embodiments, the first structure 1100F may be or include a peripheral circuit structure including a decoder circuit 1110, a page buffer 1120, and a logic circuit 1130. The second structure 1100S may a memory cell structure including a bitline BL, a common source line CSL, wordlines WL, first and second upper gate lines UL1 and UL2, first and second lower gate lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to some example embodiments.

In some example embodiments, the upper transistors UT1 and UT2 may include string select transistors, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT2 may be used in an erase operation in which data, stored in memory cell transistors MCT, is erased using gate induced drain leakage (GIDL) current.

The common source line CSL, the first and second lower gate lines LL1 and LL2, the wordlines WL, and the first and second upper gate lines UL1 and UL2 may be electrically connected to the decoder circuit 1110 through first connection wirings 1115, extending to the second structure 1100S, within the first structure 1100F. The bitlines BL may be connected to the page buffer 1120 through second connection wirings 1125, extending to the second structure 1100S, within the first structure 1100F.

In the first structure 1100F, the decoder circuit 1110 and/or the page buffer 1120 may execute a control operation for at least one memory cell transistor MCT, among a plurality of memory cell transistors MCT. The decoding circuit 1110 and the page buffer 1120 may be controlled by the logic circuit 1130. The semiconductor device 1100 may communicate with the controller 1200 through an input/output (I/O) pad 1101 electrically connected to the logic circuit 1130. The I/O pad 1101 may be electrically connected to the logic circuit 1130 through an input/output (I/O) connection wiring 1135, extending to the second structure 1100S, within the first structure 1100F.

The controller 1200 may include a processor 1210, a NAND controller 1220, and a host interface 1230. According to some example embodiments, the data storage system 1000 may include a plurality of semiconductor devices 1100. In this case, the controller 1200 may control the plurality of semiconductor devices 1100.

The processor 1210 may control overall operations of the data storage system 1000 including the controller 1200. The processor 1210 may operate based on predetermined firmware, and may control a NAND controller 1220 to access the semiconductor device 1100. The NAND controller 1220 may include a controller interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the controller interface 1221. The host interface 1230 may provide a communications function between the data storage system 1000 and an external host. When a control command is received from the external host through the host interface 1230, the processor 1210 may control the semiconductor device 1100 in response to the control command.

Figure 12:
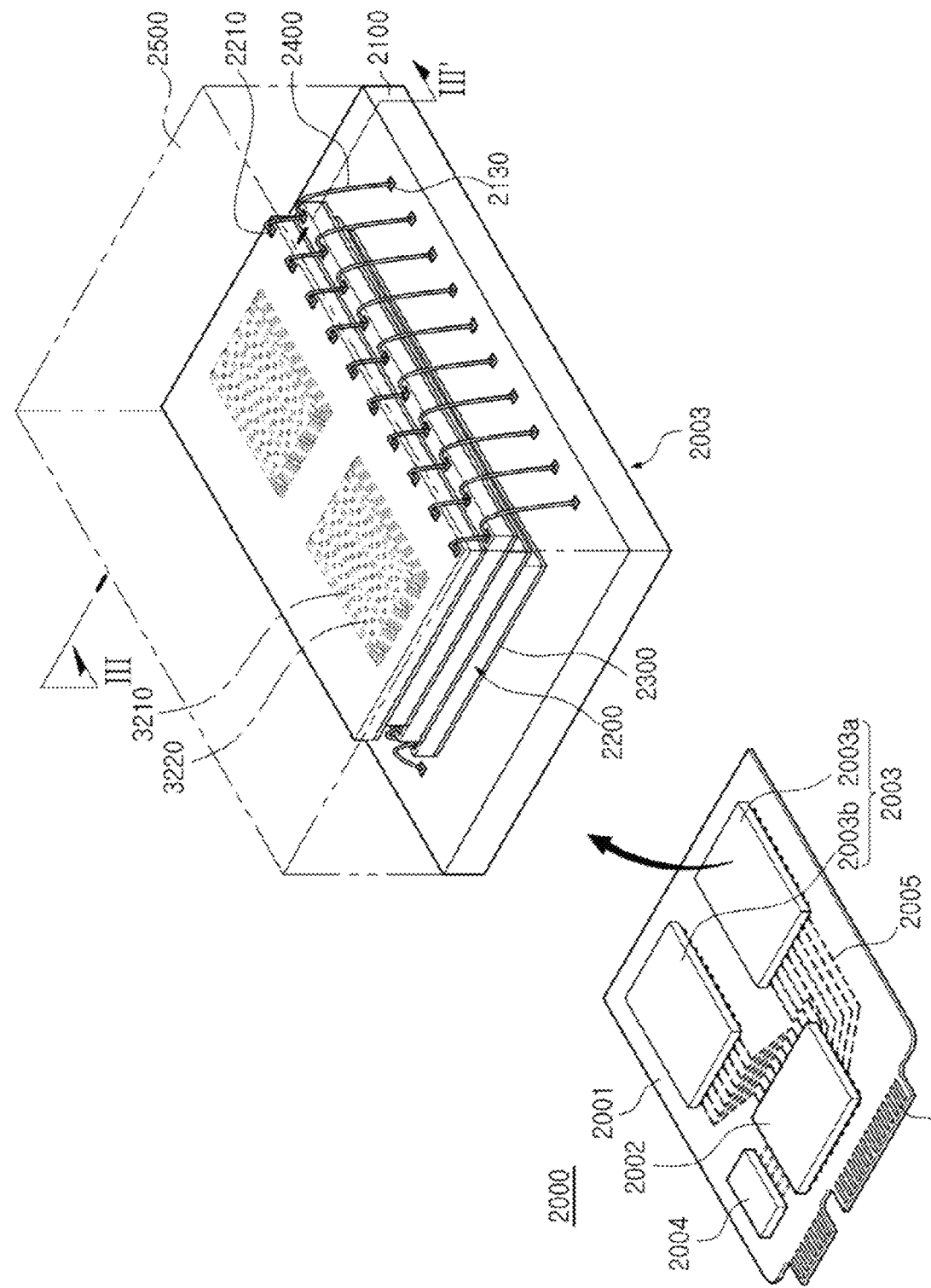
FIG. 12 is a schematic perspective view of a data storage system including a semiconductor device according to an example embodiment.

FIG. 12 is a schematic perspective view of a data storage system including a semiconductor device according to an example embodiment.

Referring to FIG. 12, a storage system 2000 according to some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 through wiring patterns 2005 formed on the main substrate 2001.

The main substrate 2001 may include a connector 2006 including a plurality of pins coupled to the external host. In the connector 2006, the number and disposition of the plurality of pins may vary depending on a communications interface between the data storage system 2000 and the external host. In some example embodiments, the data storage system 2000 may communicate with the external host based on an interface, among interfaces such as universal serial bus (USB), peripheral component interconnect express (PCI-Express), serial advanced technology attachment (SATA), M-PHY for universal flash storage (UFS), and the like. In some example embodiments, the data storage system 2000 may operate with power supplied from the external host through a connector 2006. The data storage system 2000 may further include a power management integrated circuit (PMIC) dividing the power, supplied from the external host, to the controller 2002 and the semiconductor package 2003.

The controller 2002 may write data to the semiconductor package 2003 or read data from the semiconductor package, and may increase operating speed of the data storage system 2000.

The DRAM 2004 may be or may include a buffer memory for reducing a difference in speeds between the semiconductor package 2003, used as a data storage space, and the external host. The DRAM 2004, included in the data storage system 2000, may operate as a type of cache memory and may provide a space for temporarily storing data during a control operation for the semiconductor package 2003. When the DRAM 2004 is included in the data storage system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2203b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including an upper package pads 2130. Each of the semiconductor chips 2200 may include an input/output (I/O) pad 2210. The I/O pad 2210 may correspond to the I/O pad 1101 of FIG. 11. Each of the semiconductor chips 2200 may include gate stack structures 3210 and channel structures 3220. Each of the semiconductor chips 2200 may include the semiconductor device described with reference to FIGS. 1 to 8B.

In some example embodiments, the connection structure 2400 may be a bonding wire electrically connecting the I/O pad 2210 and the upper package pads 2130 to each other. Accordingly, in each of the first and second semiconductor packages 2003a and 2003b, the semiconductor chips 2200 may be electrically connected to each other by wire bonding, and may be electrically connected to the upper package pads 2130 of the package substrate 2100. According to some example embodiments, in each of the first and second semiconductor packages 2003a and 2003b, the semiconductor chips 2200 may be electrically connected to each other by a connection structure including a through-silicon via (TSV) rather than the connection structure 2400 using wire bonding.

In some example embodiments, the controller 2002 and the semiconductor chips 2200 may be included in a single package. In some example embodiments, the controller 2002 and the semiconductor chips 2200 may mounted on an additional interposer substrate, different from the main substrate 2001, and the controller 2002 and the semiconductor chips 2200 may be connected to each other by a wiring formed on the interposer substrate.

Figure 13:
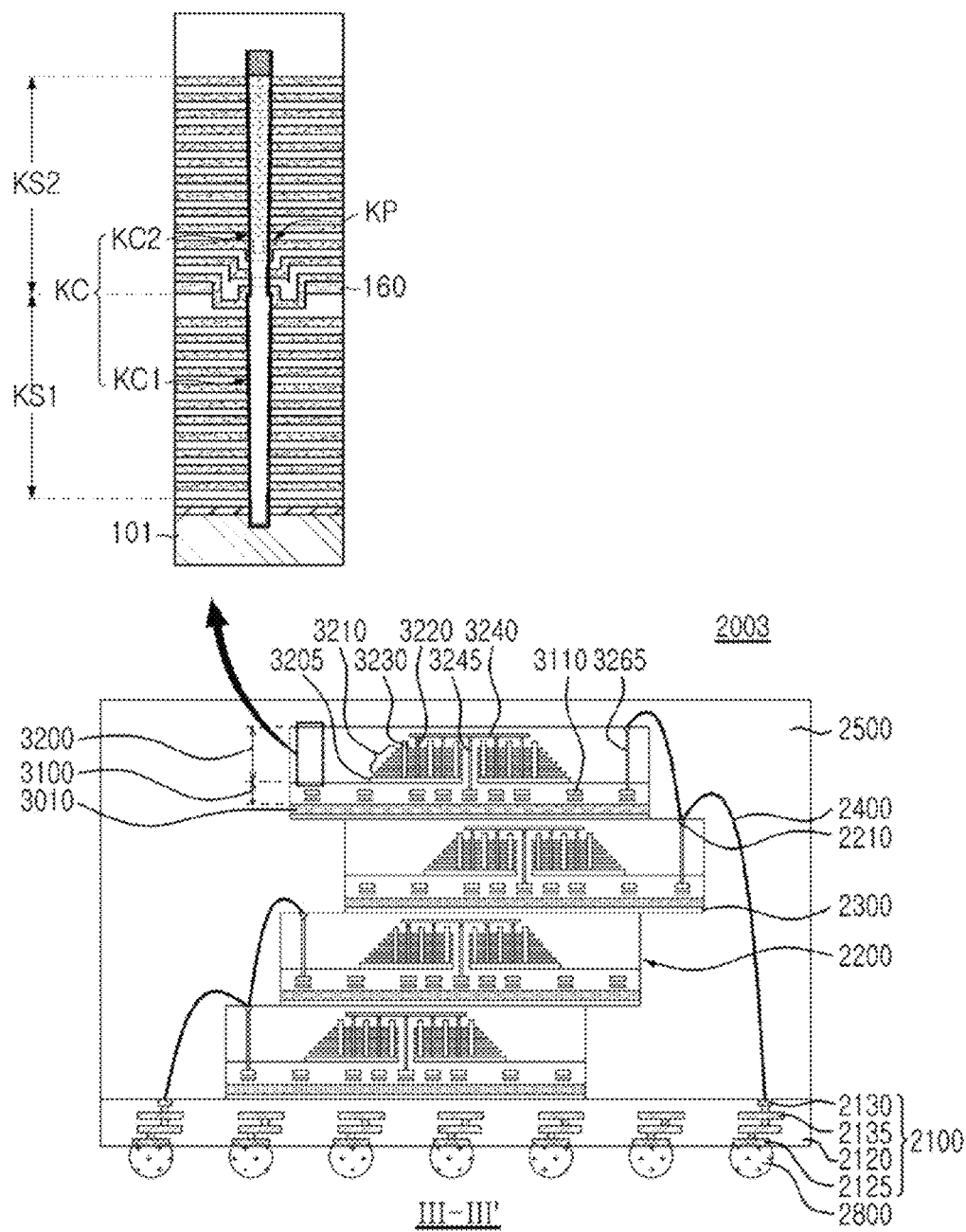
FIG. 13 is a schematic cross-sectional view of a semiconductor package according to an example embodiment.

FIG. 13 is a schematic cross-sectional view of a semiconductor package according to an example embodiment. FIG. 13 illustrates an example embodiment of the semiconductor package 2003 of FIG. 12, and conceptually illustrates a region cut along line III-III' of the semiconductor package 2003 of FIG. 12.

Referring to FIG. 13, in a semiconductor package 2003, a package substrate 2100 may be a printed circuit board (PCB). The package substrate 2100 may include a package substrate body portion 2120, upper package pads 2130 (see FIG. 12) disposed on an upper surface of the package substrate body portion 2120, lower pads 2125 disposed on a lower surface of the package substrate body portion 2120 or exposed through the lower surface of the package substrate body portion 2120, and internal wirings 2135 electrically connecting the upper package pads 2130 and the lower pads 2125 to each other inside the package substrate body portion 2120. The upper package pads 2130 may be electrically connected to the connection structures 2400. The lower pads 2125 may be connected to wiring patterns 2005 of the main substrate 2001 of the data storage system 2000, as illustrated in FIG. 12, through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may have a peripheral circuit region including peripheral wirings 3110. The second structure 3200 may include a common source line 3205, a gate stack structure 3210 on the common source line 3205, channel structures 3220 and separation regions 3230 penetrating through the gate stacking structure 3210, and bitlines 3240 electrically connected to the memory channel structures 3220. As described above with reference to FIGS. 1A to 8A, in one region of each of the semiconductor chips 2200, a key pattern portion KP and an alignment structure KC for alignment during a fabrication process may be formed.

Each of the semiconductor chips 2200 may include a through-wiring 3245 electrically connected to peripheral wirings 3110 and extending inwardly of the second structure 3200. The through-wiring 3245 may be disposed on an external side of the gate stack structure 3210, and may be further disposed to penetrate through the gate stack structure 3210. Each of the semiconductor chips 2200 may further include an input/output connection wiring 3265 electrically connected to the peripheral wirings 3110 of the first structure 3100 and extending into the second structure 3200 an input/output (I/O) pad 2210 electrically connected to the input/output connection wiring 3265.

As described above, by improving or optimizing a process of fabricating an alignment structure, a layer on a first alignment structure may be formed to have an upper surface disposed on three levels. Accordingly, a semiconductor device having improved reliability and a data storage system including the same may be provided.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While some example embodiments have been shown and described above, it will be apparent that modifications and variations could be made without departing from the scope of the present inventive concepts.

What is claimed is:

1. A semiconductor device comprising:
a substrate having a first region and a second region;
a first stack structure in the first region, the first stack structure including lower gate electrodes spaced apart from each other and stacked in a first direction, the first direction perpendicular to an upper surface of the substrate;
a first channel structure penetrating through the first stack structure and in contact with the substrate;
a second stack structure on the first stack structure and the first channel structure, the second stack structure including upper gate electrodes spaced apart from each other and stacked in the first direction;
a second channel structure penetrating through the second stack structure and connected to the first channel structure;
a first molding structure in the second region, the first molding structure including lower horizontal sacrificial layers spaced apart from each other and stacked in the first direction;
a first alignment structure penetrating through the first molding structure and in contact with the substrate;
a second molding structure on the first molding structure and the first alignment structure, the second molding structure including upper horizontal sacrificial layers spaced apart from each other and stacked in the first direction;
a second alignment structure penetrating through the second molding structure and connected to the first alignment structure; and
a protective layer between the first molding structure and the second molding structure,
wherein among the upper horizontal sacrificial layers, a lowermost first horizontal sacrificial layer has an upper surface on a first level on the first alignment structure, a second level on the first molding structure of a periphery of the first alignment structure, and a third level on the protective layer, the second level is lower than the first level, and the third level is higher than the first level.

2. The semiconductor device of claim 1, wherein the first region is a memory cell region including memory cells, and the second region is an alignment key region including alignment keys.

3. The semiconductor device of claim 1, wherein the lowermost first horizontal sacrificial layer covers a portion of an upper surface of the first alignment structure and a portion of a side surface of the first alignment structure.

4. The semiconductor device of claim 1, wherein
at least one of the upper horizontal sacrificial layers has a key pattern portion on an upper surface thereof, and
the key pattern portion is recessed to correspond to the first alignment structure.

5. The semiconductor device of claim 1, wherein the lowermost first horizontal sacrificial layer has a recessed portion along the periphery of the first alignment structure.

6. The semiconductor device of claim 5, wherein the protective layer is on a periphery of the recessed portion.

7. The semiconductor device of claim 1, wherein the protective layer is spaced apart from the first alignment structure and the second alignment structure in a second direction, perpendicular to the first direction.

8. The semiconductor device of claim 1, wherein the first molding structure has an uppermost surface lower than the first level and higher than the second level.

9. The semiconductor device of claim 1, wherein the first alignment structure has an upper surface on a same level as an uppermost surface of the first molding structure.

10. The semiconductor device of claim 1, wherein
the first channel structure is on a same level as the first alignment structure, and
the second channel structure is on a same level as the second alignment structure.

11. The semiconductor device of claim 1, wherein
the first channel structure and the second channel structure are connected to each other to define a channel structure,
the first alignment structure and the second alignment structure are connected to each other to define an alignment structure, and
the channel structure and the alignment structure have a same internal structure.

12. The semiconductor device of claim 1, wherein among the upper gate electrodes, a lowermost first gate electrode has a planar upper surface in the first region.

13. The semiconductor device of claim 1, wherein among the upper gate electrodes, a lowermost first gate electrode has an upper surface on the third level, in the first region.

14. A semiconductor device comprising:
a substrate having a first region and a second region;
a first stack structure in the first region, the first stack structure including lower gate electrodes spaced apart from each other and stacked in a first direction, the first direction perpendicular to an upper surface of the substrate;
a first channel structure penetrating through the first stack structure and in contact with the substrate;
a second stack structure on the first stack structure and the first channel structure, the second stack structure including upper gate electrodes spaced apart from each other and stacked in the first direction;
a second channel structure penetrating through the second stack structure and connected to the first channel structure;
a first molding structure in the second region, the first molding structure including lower horizontal sacrificial layers spaced apart from each other and stacked in the first direction;
a first alignment structure penetrating through the first molding structure and in contact with the substrate;
a second molding structure on the first molding structure and the first alignment structure, the second molding structure including upper horizontal sacrificial layers spaced apart from each other and stacked in the first direction, and the second molding structure having a key pattern portion recessed downwardly on the first alignment structure; and a protective layer between the first molding structure and the second molding structure.

15. The semiconductor device of claim 14, wherein the second molding structure further includes interlayer insulating layers stacked alternately with the upper horizontal sacrificial layers, and each of the upper horizontal sacrificial layers and the interlayer insulating layers has the key pattern portion.

16. The semiconductor device of claim 14, wherein the second molding structure covers an entire upper surface of the first alignment structure.

17. The semiconductor device of claim 14, wherein among interlayer insulating layers of the second molding structure, a lowermost interlayer insulating layer is in contact with the first alignment structure.

18. The semiconductor device of claim 14, wherein the second molding structure is disposed to partially recess the first molding structure from an upper surface of the first molding structure on a periphery of the first alignment structure.

19. A data storage system comprising:
a semiconductor storage device including a substrate having a first region and a second region, circuit devices on one side of the substrate, and an input/output pad electrically connected to the circuit devices; and
a controller electrically connected to the semiconductor storage device through the input/output pad and configured to control the semiconductor storage device,
wherein the semiconductor storage device further includes a first stack structure in the first region, the first stack structure including lower gate electrodes spaced apart from each other and stacked in a first direction, the first direction perpendicular to an upper surface of the substrate;
a first channel structure penetrating through the first stack structure and in contact with the substrate;
a second stack structure on the first stack structure and the first channel structure, the second stack structure including upper gate electrodes spaced apart from each other and stacked in the first direction;
a second channel structure penetrating through the second stack structure and connected to the first channel structure;
a first molding structure in the second region, the first molding structure including lower horizontal sacrificial layers spaced apart from each other and stacked in the first direction;
a first alignment structure penetrating through the first molding structure and in contact with the substrate;
a second molding structure on the first molding structure and the first alignment structure, the second molding structure including upper horizontal sacrificial layers spaced apart from each other and stacked in the first direction, and the second molding structure having a key pattern portion recessed downwardly on the first alignment structure; and
a protective layer between the first molding structure and the second molding structure.

20. The data storage system of claim 19, wherein the protective layer does not overlap the first alignment structure in the first direction.

* * * * *